United States Patent [19]

Kajigaya et al.

[11] Patent Number: 5,426,616

[45] Date of Patent: Jun. 20, 1995

[54] SEMICONDUCTOR IC DEVICE HAVING A VOLTAGE CONVERSION CIRCUIT WHICH GENERATES AN INTERNAL SUPPLY VOLTAGE HAVING VALUE COMPENSATED FOR EXTERNAL SUPPLY VOLTAGE VARIATIONS

[75] Inventors: Kazuhiko Kajigaya; Tetsu Udagawa, both of Iruma; Kyoko Ishii, Tokyo; Manabu Tsunozaki; Kazuyoshi Oshima, both of Ohme; Masashi Horiguchi, Kawasaki; Jun Etoh, Hachioji; Masakazu Aoki, Tokorozawa; Shin'ichi Ikenaga, Koganei; Kiyoo Itoh, Higashikurume, all of Japan

[73] Assignee: Hitachi, Ltd., Tokyo, Japan

[21] Appl. No.: 243,100

[22] Filed: May 16, 1994

Related U.S. Application Data

[63] Continuation of Ser. No. 703,794, May 21, 1991, abandoned.

[30] Foreign Application Priority Data

| May 21, 1990 | [JP] | Japan | 2-129217 |
| Aug. 17, 1990 | [JP] | Japan | 2-217662 |
| May 15, 1991 | [JP] | Japan | 3-110129 |

[51] Int. Cl.⁶ ............................................. G11C 11/407
[52] U.S. Cl. ........................ 365/226; 365/189.09; 365/228; 365/229; 365/225.7; 365/201; 307/23; 307/64; 307/65; 307/80; 327/543; 327/544
[58] Field of Search .................. 365/189.09, 226, 228, 365/229, 225.7, 201; 307/23, 64, 65, 80, 296.1, 296.3, 296.6, 296.7, 296.8

[56] References Cited

U.S. PATENT DOCUMENTS

| 4,446,534 | 5/1984 | Smith | 365/225.7 |
| 4,916,389 | 4/1990 | Hori et al. | 324/158 |
| 4,994,688 | 2/1991 | Horiguchi et al. | 307/296.8 |
| 5,086,238 | 2/1992 | Watanabe | 307/296.6 |
| 5,179,539 | 1/1993 | Horiguchi et al. | 365/226 |
| 5,254,880 | 10/1993 | Horiguchi et al. | 307/296.1 |

FOREIGN PATENT DOCUMENTS 2198096  8/1990  Japan .

OTHER PUBLICATIONS

John Markus, "Modern Electronic Circuits Reference Manual", 1980, p. 808-McGraw-Hill.

*Primary Examiner*—Benny Lee
*Assistant Examiner*—Reginald A. Ratliff
*Attorney, Agent, or Firm*—Antonelli, Terry, Stout & Kraus

[57] ABSTRACT

A voltage conversion circuit of the present invention is equipped with means for generating a first voltage stabilized with respect to ground potential of a semiconductor integrated circuit device including the circuit, means for generating second voltage stabilized with respect to an external supply voltage of the semiconductor integrated circuit device, and selection means for selecting either the first voltage or the second voltage. The first voltage age, stabilized with respect to the ground potential, is selected and used as the voltage at the time of normal operation, and the second voltage, stabilized with respect to the external supply voltage, is selected and used at the time of aging test. In this case, means for trimming the first voltage and/or the second voltage is, preferably, provided to raise the voltage accuracy.

89 Claims, 27 Drawing Sheets 110, 111, 112, 113 .... ACTIVE REGION
120, 121 .... GATE MATERIAL (POLYCRYSTALLINE SILICON ETC.)
130, 131 .... CONTACT HOLE
140, 141, 142, 143 .... WIRING MATERIAL (ALUMINIUM ETC.)

- 100 .... P SUBSTRATE
- 101 .... N WELL
- 114 .... ACTIVE REGION
- 115 .... n + DIFFUSION LAYER
- 122 .... GATE MATERIAL (POLYCRYSTALLINE SILICON ETC.)
- 132, 133 .... CONTACT HOLE
- 144, 145 .... WIRING MATERIAL (ALMINIUM ETC.)

45, 46 .... INVERTER
47 .... NAND GATE

INTERNAL SUPPLY VOLTAGE GENERATOR

SEMICONDUCTOR IC DEVICE HAVING A VOLTAGE CONVERSION CIRCUIT WHICH GENERATES AN INTERNAL SUPPLY VOLTAGE HAVING VALUE COMPENSATED FOR EXTERNAL SUPPLY VOLTAGE VARIATIONS

This application is a continuation of application Ser. No. 07/703,794, filed on May 21, 1991, now abandoned.

BACKGROUND OF THE INVENTION

1. Field of the Invention

The present invention relates to a semiconductor integrated circuit device and, particularly, to a device in which there is effected a technique applied to a dynamic type RAM (random access memory) containing a voltage inversion circuit, for example.

2. Description of the Prior Art

As miniaturizations of circuit elements have made advances with high integration and mass storage, a method to reduce the working value of an internal supply voltage in a chip to e.g., approximately +3.3 V has been adopted as one means in compensating for the reduction of dielectric strength. Regarding this since it is highly effective to standardize and unify an external supply voltage, fed from the outside, for example, +5.0 V, a dynamic type RAM, etc., is provided with a voltage conversion circuit for forming the voltage of the above-mentioned internal power supply to be stabilized, i.e. by reducing voltages of the external supply voltage.

On the other hand, among the above-mentioned dynamic RAM etc., for example, in order to be able to detect early a MOSFET (metal oxide semiconductor field effect transistor, in this specification, MOSFET is a general designation for insulated gate type field effect transistor) which is likely to cause interference due to, for example, defects of a gate oxide film, a so-called burn-in (aging) test is carried out performing an acceleration test with the power supply voltage and ambient temperature abnormally raised. At this time, the value of the internal power supply voltage is raised immediately before a normal circuit element becomes destroyed, and an error detection ratio and test efficiency will be raised.

Known dynamic type RAMs containing a voltage conversion circuit are described in Japanese patent application laid-open No. 110225/1984 etc. Also, known voltage conversion circuits (e.g., voltages limiter circuit or voltage reducing circuit) for producing an internal supply voltage from an external supply voltage are discussed in the following Japanese unexamined patent applications:

patent application laid-open No. 111514/1984 and
patent application laid-open No. 185461/1989

These patent applications also make reference to an aging (burn-in) test of a semiconductor device. That is to say, the dependency of the internal power supply voltage on the external power supply voltage is made smaller in the normal operation whereas the dependency is made larger at the time of aging test. Therefore the operation of the circuit operating with the internal power supply voltage as a power source becomes stable at the time of normal operation, and at the time of the aging test a sufficiently higher voltage than that of the normal operation is applied.

With respect to the above-mentioned prior art, the accuracy of the internal power supply voltage with the aging of the semiconductor device has not been considered sufficiently.

In addition, the standard voltage generating circuit is described in the IEEE Journal of Solid-State Circuits, Vol. SC-15, No.3, pp. 264–269, June 1980 and Japanese patent application laid-open No. 296491/1989.

SUMMARY OF THE INVENTION

An object of the present invention is to provide a voltage converter which can set freely and accurately the value of the internal supply voltage even at the time of an aging test.

Another object of the invention is to suppress the output voltage variation in burn-in range of the voltage converter which is contained in dynamic type RAMs etc. and having the burn-in range.

A further object of the invention is to elevate the screening accuracy in burn-in test of dynamic type RAMs having voltage converters and to elevate the reliabilities of the dynamic type RAMs.

Still another object of the invention is to elevate test efficiency and yield for dynamic type RAMs and to attempt to reduce those costs.

The foregoing and other objects and novel features of the present invention will become clear from the description of the specification and the accompanying drawings.

To achieve the above-mentioned objects, a voltage conversion circuit of the present invention is characterized by being provided with means for generating the first voltage stabilized with reference to ground voltage of a semiconductor device including the voltage conversion circuit, means for generating the second voltage stabilized with reference to an external power supply voltage of the above semiconductor device, and selection means for selecting either one of the first and second voltages. That is, according to the present invention, a stabilized voltage with reference to ground voltage can be selectively used as the voltage for normal operation, and a stabilized voltage with reference to an external power supply voltage can be selectively used as the voltage for effecting an aging test.

Here, it is desirable to have means for trimming the first voltage and/or the second voltage in order to raise the voltage accuracy.

For example, the voltage conversion circuit being contained in the dynamic type RAM and having a so-called burn-in range in which the output voltage, that is, the value of internal supply voltage, is elevated in proportion to the external supply voltage at operation in an acceleration test is furnished with a plurality of fuse means capable of selectively changing the values of the internal supply voltage in the burn-in range by being disconnected with a given combination. Further, a dummy disconnecting means capable of making these fuse means artificially disconnected is provided, so that the value of internal power supply voltage can be monitored through given external terminals in the given test modes.

By the above-mentioned means, the value of the internal power supply voltage can be set accurately in the burn-in range. Further, as variations due to manufacture dispersion can be suppressed by providing the trimming means, the values of the above internal power supply voltage can be set more accurately.

Therefore, the error detection rate of burn-in test, that is, the screening accuracy can be elevated as well as faults of normal circuit elements due to so-called overkill can be decreased and the product yield can be raised. As a result, the reduction of cost can be realized and, also, the reliability of dynamic type RAMs, etc., can be enhanced.

DESCRIPTION OF THE PREFERRED EMBODIMENTS

Figure 1:
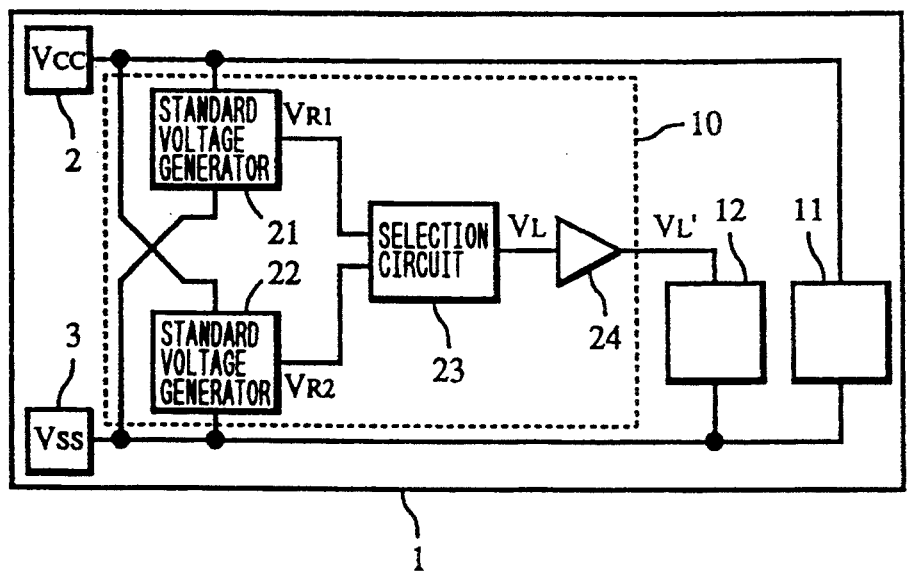
FIG. 1 is a block diagram of a semiconductor device having a voltage conversion circuit as an embodiment of the invention.

FIG. 1 shows a constitution of a semiconductor integrated circuit as an embodiment of the present invention. A semiconductor chip 1 contains therein a terminal 2 for an external supply voltage Vcc, a terminal 3 for ground voltage Vss, a voltage conversion circuit 10 for generating an internal supply voltage $V_L$, a circuit 11 to be operated on receiving the supply voltage Vcc, and a circuit 12 to be operated on receiving the supply voltage $V_L$. The voltage conversion circuit 10 comprises two standard voltage generators 21, 22, a selection circuit 23 and a driver 24. $V_{R1}$ is the standard voltage for normal operation and $V_{R2}$ is the standard voltage for performing and aging test, and the selection circuit 23 selects that one of $V_{R1}$ and $V_{R1}$ which is larger. This embodiment is characterized by forming the voltage $V_{R2}$ in relation to the voltage Vcc. This will be explained by using FIG. 2, giving concrete numerical examples.

Figure 2:
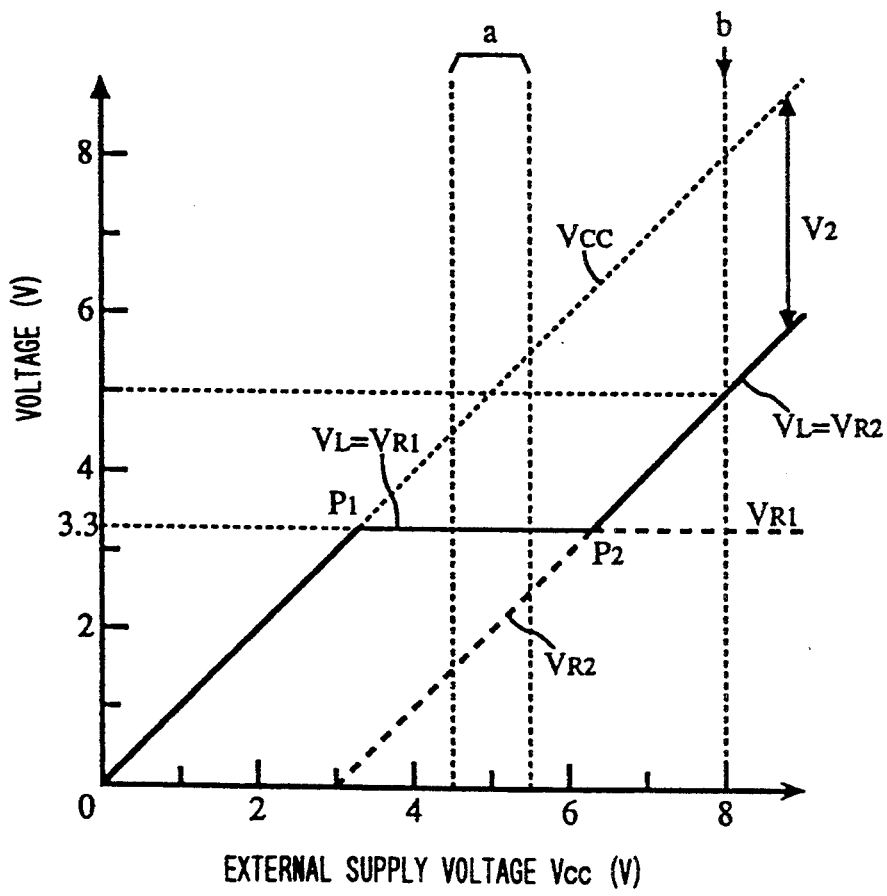
FIG. 2 is a graph showing DC characteristics of the embodiment in FIG. 1.

FIG. 2 is a graph showing an example of the relation between the Vcc and each voltage. Here, the value of Vcc for normal operation is 4.5–5.5 V, and the value of the internal supply voltage $V_L$ is 3.3 V. The standard voltage generator 21 generates positive voltage $V_{R1}$ stabilized in relation to ground voltage Vss. Here, $V_{R1}$ is 3.3 V. In comparison with this, the standard voltage generator 22 generates the voltage $V_{R2}$ stabilized in relation to the supply voltage Vcc. That is, the difference voltage $V_2$ between the supply voltage Vcc and the voltage $V_{R2}$ becomes approximately constant, independent of the value of the supply voltage Vcc. For example, when the circuit 11 and the circuit 12 are subjected to the aging test at 8 V and 5 V, respectively, the voltage Vcc is made 8 V and the above difference voltage $V_2$ is made 3 V as shown in the drawing. That is, it has only to be $V_{R2} = Vcc - 3$ V. Moreover, the voltage level of the output $V_L'$ of the driver 24 is the same as that of the above-mentioned $V_L$ although not illustrated in the figure. The role of the driver 24 is in raising the current driving capability in order to drive the load circuit 12.

This embodiment is characterized in that the internal supply voltage $V_L$ can be set accurately not only at normal operation but also at aging. As a standard voltage generator 22, circuits of threshold voltage difference system and band gap system may be used, as will be described later. Moreover, the embodiment shown in FIG. 1 has a larger degree of freedom of setting the aging test voltage than the prior art. This is because the turn point $P_2$ cannot easily fall into the range of Vcc at normal operation due to the larger dependency $\partial V_L / \partial V$ of $V_L$ on Vcc at aging, according to this embodiment.

Figure 3:
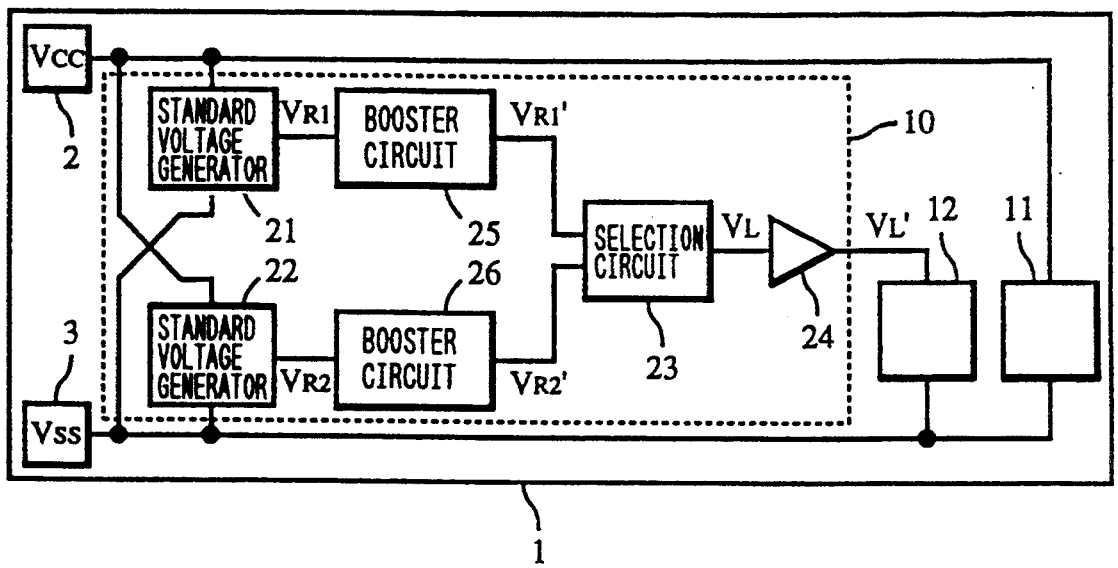
FIG. 3 is a block diagram of a semiconductor device having a voltage conversion circuit as another embodiment of the invention.
Figure 4:
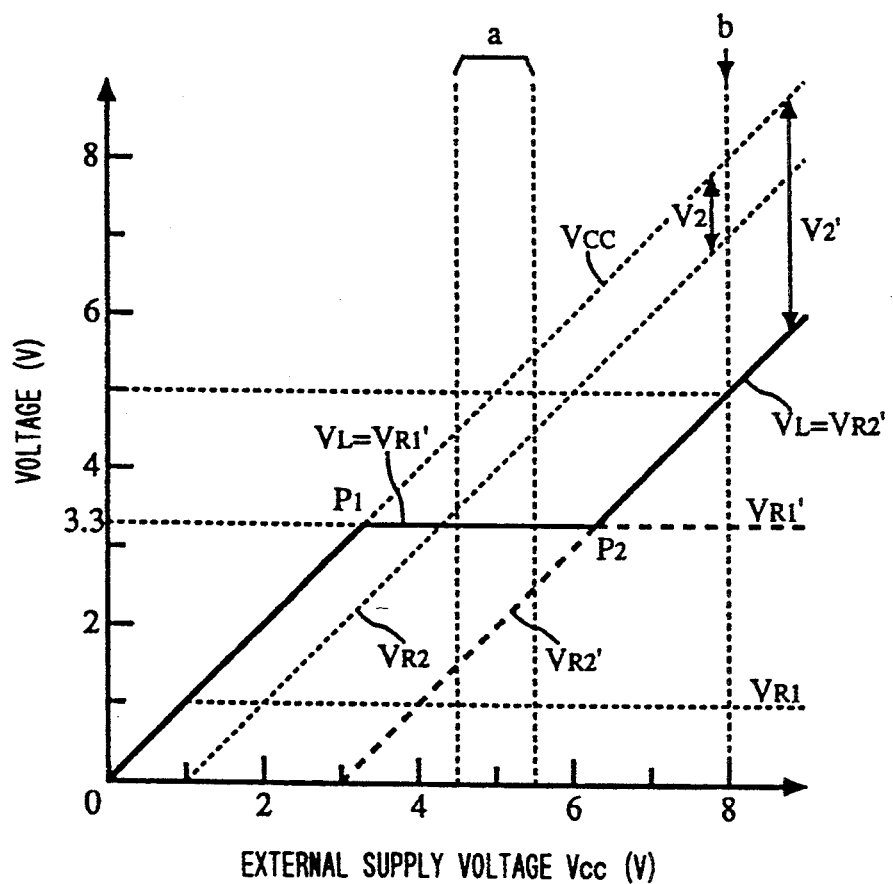
FIG. 4 is a graph showing DC characteristics of the embodiment in FIG. 3.

FIG. 3 shows another embodiment of the present invention. The difference that of from that of FIG. 1 is that booster circuits 25 and 26 are provided between the standard voltage generators 21, 22 and the selection circuit 23. In case the circuits of the later discussed threshold voltage difference system and band gap system are used as the standard voltage generators, their output voltages are not necessarily suitable voltages for the operating voltage $V_L$ of the circuit 12. The roles of the booster circuits 25, 26 are to convert the output voltage of the standard voltage generator into the suitable internal supply voltage $V_L$. FIG. 4 shows an example of a relation between the external supply voltage Vcc and each voltage. In this example, $V_{R1} = 1$ V and $V_2 = 1$ V. The booster circuit 25 produces the voltage $V_{R1}'$ which is equal to 3.3 times of $V_{R1}$ ($=3.3$ V) in relation to ground voltage Vss. On the contrary, the booster circuit 26 produces the voltage $V_2'$ which amounts three times of $V_2$ ($=3$ V) in relation to the supply voltage Vcc. In this embodiment, both $V_{R1}$ and $V_{R2}$ are boosted, but certainly either of the above may only be boosted.

Figure 5:
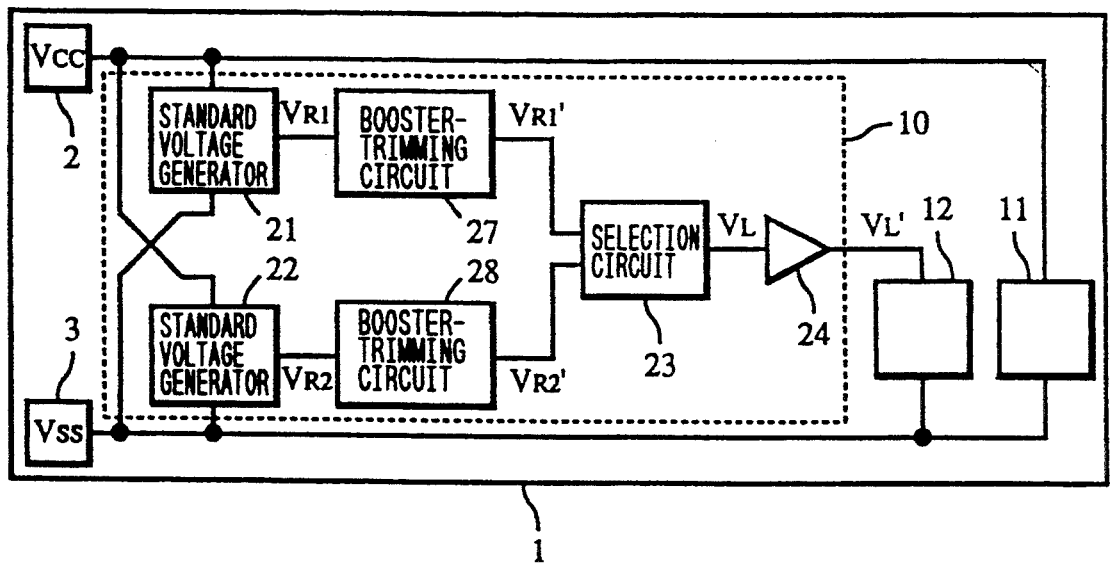
FIG. 5 is a block diagram of a semiconductor device having a voltage conversion circuit as a further embodiment of the invention.
Figure 6:
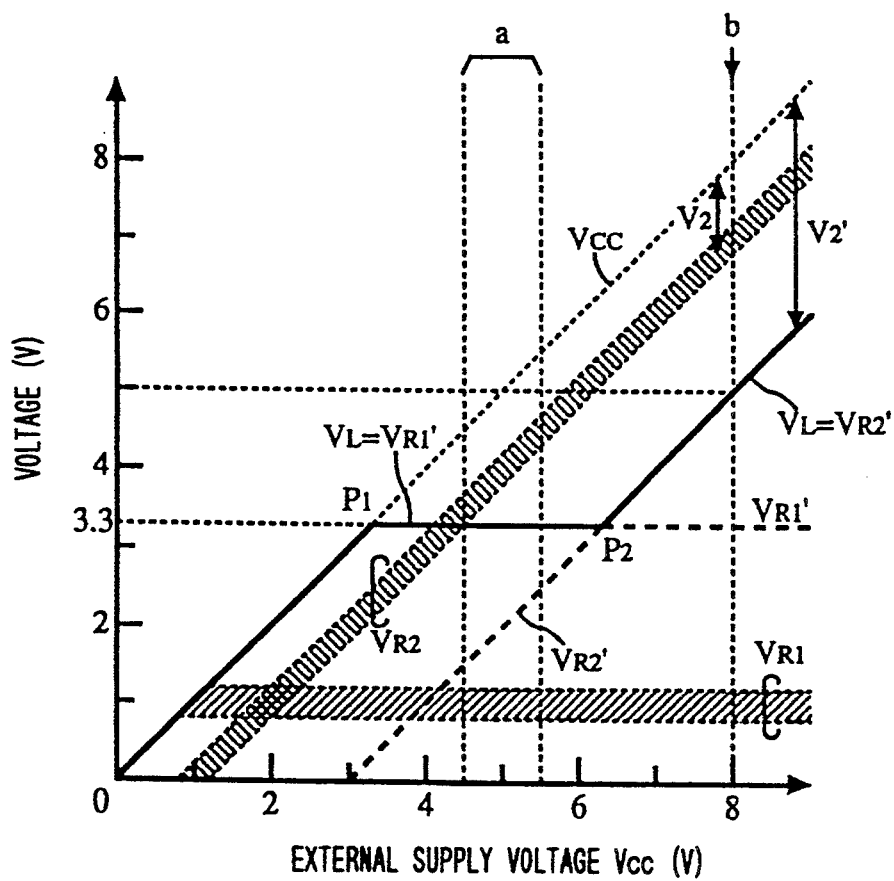
FIG. 6 is a graph showing DC characteristics of the embodiment in FIG. 5.

FIG. 5 shows another embodiment of the present invention. The difference from FIG. 3 is in that the trimming (fine adjustment of the voltage value) is made possible. Generally speaking, the output voltage of the standard voltage generator is liable to be varied by the dispersion of manufacturing process. As counter-measures for this, the scheme employed for adjusting the voltage value into a given voltage is a trimming method. In this embodiment, a trimming can be carried out by changing magnifications in converting $V_{R1}$, $V_2$ into $V_{R1}'$, $V_2'$, respectively. Even if each of $V_{R1}$ and $V_{R2}$ is dispersed as indicated in the shaded areas of FIG. 6, the dispersion of $V_{R1}'$ and $V_{R2}'$ can be suppressed by the trimming. In this embodiment, both $V_{R1}$ and $V_{R2}$ have been trimmed, but, of course, only one of the above $V_{R1}$ and $V_{R2}$ may be trimmed.

Next, the standard voltage generator used in the present invention will be explained. As above described, two kinds of circuits, that is, the circuit 21 generating a positive voltage stabilized in relation to Vss and the circuit 22 generating a negative voltage stabilized in relation to Vcc are used in the present invention. Further, in the circuit generating positive voltages, a circuit generating negative voltages can be constituted by reversing all the polarities of the transistors and reversing Vcc and Vss. On the contrary, in the circuit generating negative voltages, a circuit generating positive voltages can be constituted by reversing all the polarities of the transistors and reversing Vcc and Vss. Examples of concrete circuits will be explained using the following drawing illustrations.

Figure 7A:
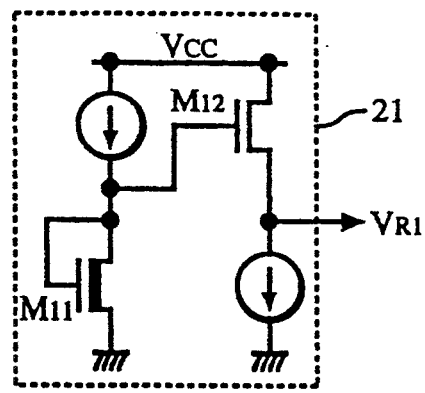
FIGS. 7(a), (b) are circuit diagrams of standard voltage generators used in the invention.
Figure 7B:
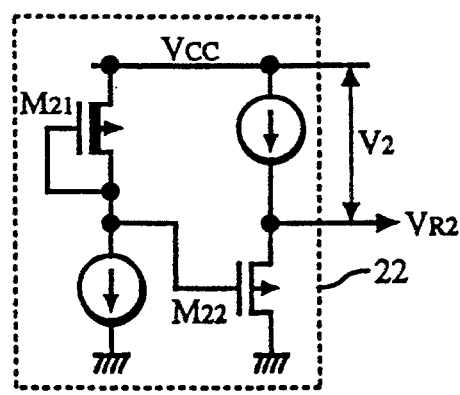

FIG. 7(a) shows a circuit taking out the difference of threshold voltages of two N-channel MOSFETs as a standard voltage. That is, assuming that the threshold voltages of MOSFETs M11, M12 are VT11, VT12, respectively, $VR1 = VT11 - VT12$. This circuit is able to be used as a standard voltage generator 21 in the invention. A circuit for generating negative voltages stabilized in relation to Vcc can be constituted by replacing the N-channel MOSFET of this circuit by P-channel MOSFET and by reversing Vcc and Vss. FIG. 7(b) shows the above circuit. In this circuit, assuming that the threshold voltages of two P-channel MOSFETs M21, M22 are VT21, VT22, respectively, $-V2 = VT21 - VT22$. That is, the equation $VR2 = Vcc - |VT21| + |VT22|$ will be deduced and the voltage VR2 stabilized in relation to Vcc is obtained. This circuit can be used as a standard voltage generator 22 in the invention.

Figure 8A:
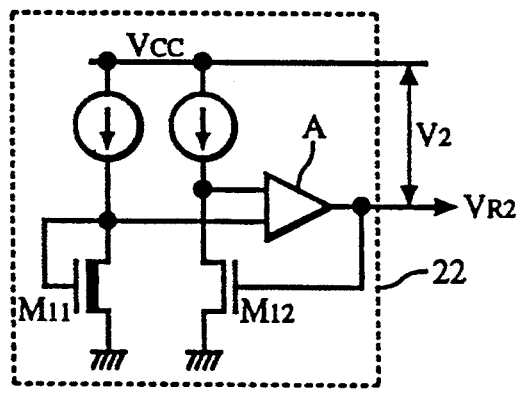
FIGS. 8(a), (b) are circuit diagrams of other standard voltage generator used in the invention.
Figure 8B:
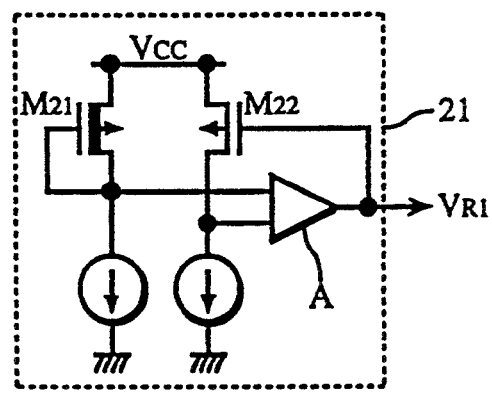

FIG. 8(a) also shows a standard voltage generator described in the above paper. In FIG. 8(a), A is a differential amplifier. This is also a circuit taking out the difference of threshold voltages between MOSFETs M11 and M12 as a standard voltage. The output voltage of this circuit, however, is voltage VR2 lower than the voltage value in relation to Vcc by the given voltage value V2. The difference voltage V2 is stable for the variation of Vcc. This circuit can be used as a standard voltage generator 22 of the present invention. Replacing the N-channel MOSFET of this circuit by P-channel MOSFET and reversing Vcc and Vss, a circuit for generating positive voltages stabilized in relation to Vss can be constituted. FIG. 8(b) shows the above circuit. This circuit can be used as a standard voltage generator 21 of the present invention.

Figure 9A:
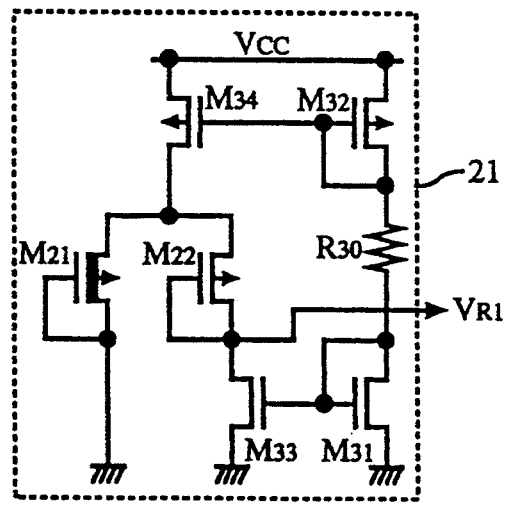
FIGS. 9(a), (b), (c), (d) are circuit diagrams of still other standard voltage generator used in the invention.
Figure 9B:
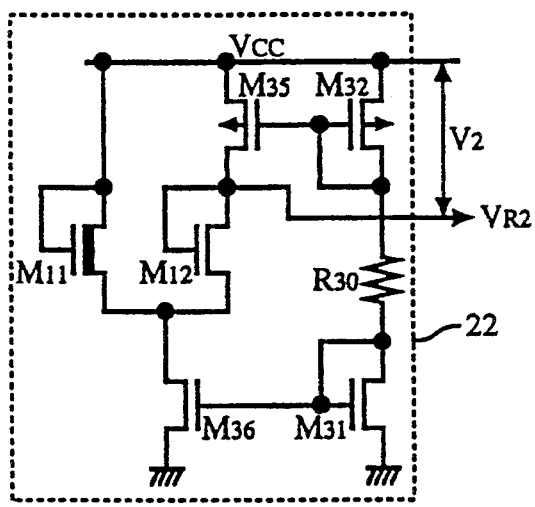
Figure 9C:
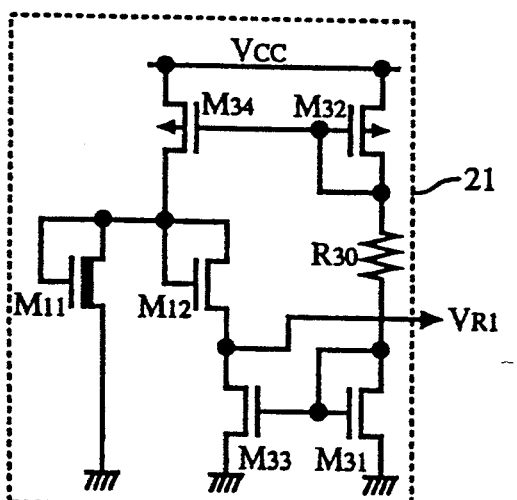
Figure 9D:
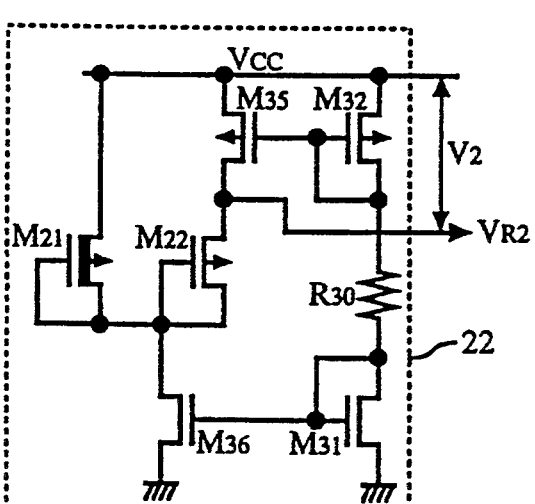

The circuit shown in FIG. 9(a) is a circuit taking out the threshold voltage difference between two P-channel MOSFETs M21 and M22 having different threshold voltages as a standard voltage VR1. This circuit can be used as a standard voltage generator 21 of the present invention. A circuit for generating negative voltages stabilized in relation to Vcc can be constituted by reversing all the polarities of the MOSFETs of this circuit and by reversing Vcc and Vss. FIG. 9(b) shows the above circuit. This circuit can be used as a standard voltage generator 22 of the present invention. FIG. 9(c) shows a circuit where the P-channel MOSFETs M21, M22 in the circuit of FIG. 9(a) are replaced by N-channel MOSFETs M11, M12, and the threshold voltage difference between M11 and M12 becomes a standard voltage VR1. This circuit can be used as a standard voltage generator 21 of the present invention. A circuit for generating negative voltages stabilized in relation to Vcc can be constituted by reversing all the polarities of the MOSFETs in the circuit of FIG. 9(c) and by reversing Vcc and Vss. FIG. 9(d) shows the above circuit. This circuit can be used as a standard voltage generator 22 of the present invention.

Figure 10:
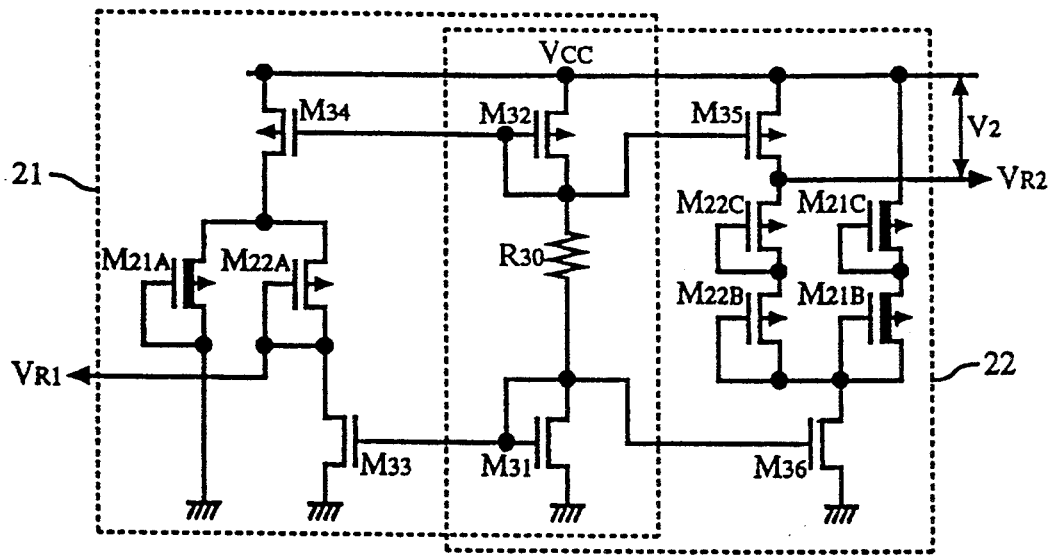
FIG. 10 is a circuit diagram of another standard voltage generator used in the invention.

Every circuit in FIGS. 7-9 forms a system relating to the threshold voltage difference between MOSFETs. These circuits are characterized in that the temperature dependencies of the standard voltages are reduced on account of the offsets of the temperature dependencies of the threshold voltages. These circuits are classified into circuits based on threshold voltage differences of N-channel MOSFETs and circuits based on threshold voltage differences of P-channel MOSFETs. When the circuits are used in the present invention, it is desirable to combine circuits using the threshold voltage differences of the same channel to MOSFETs, because the increase of processes to manufacture the MOSFETs having different threshold voltages can be reduced. An example of combining the circuits using the threshold voltage differences of P-channel MOSFETs is shown in FIG. 10. Here, the circuit in FIG. 9(a) is used as a standard voltage generator 21, and the circuit in FIG. 9(d) is used as a standard voltage generator 22. An operating point setting circuit composed of MOSFETs M31, M32 and a resistor R30 is used commonly by the circuit 21 and the circuit 22, thereby the occupied area on the semiconductor chip and the consumed power can be reduced. Moreover, as shown in the circuit 22, a plurality of (two in this case) MOSFETs having different threshold voltages are connected in series, thereby the output voltage can be obtained as an integer multiple (two times in this case) of the threshold voltage difference. If the threshold voltage of the MOSFETs M21B, M21C is VT21 and the threshold voltage of the MOSFETs M22B, M22C is VT22, it follows that $-V2 = 2(VT21 - VT22)$, i.e., $VR2 = Vcc - 2(|VT21| - |VT22|)$.

Further, a current-mirror circuit in a standard voltage generator will be explained. The MOSFETs M31, M33 and the MOSFETs M32, M34 in FIG. 9(a) and FIG. 9(c) form so-called current mirror circuits, with source and gate connected respectively. The MOSFETs M31, M36 and the MOSFETs M32, M35 in FIG. 9(b) and FIG. 9(d) and the MOSFETs M31, M33, M36 and the MOSFETs M32, M34, M35 in FIG. 10 also form current mirror circuits. Ratio of currents flowing into each MOSFET forming a current mirror circuit is equal to ratio of (channel width/channel length) of each FET. The channel width and the channel length of each FET must be set accurately in order to set the current ratio accurately. Therefore, in order to reduce the effect of influence of variation in the manufacturing process, the following considerations in the design layout are recommended.

Figure 11A:
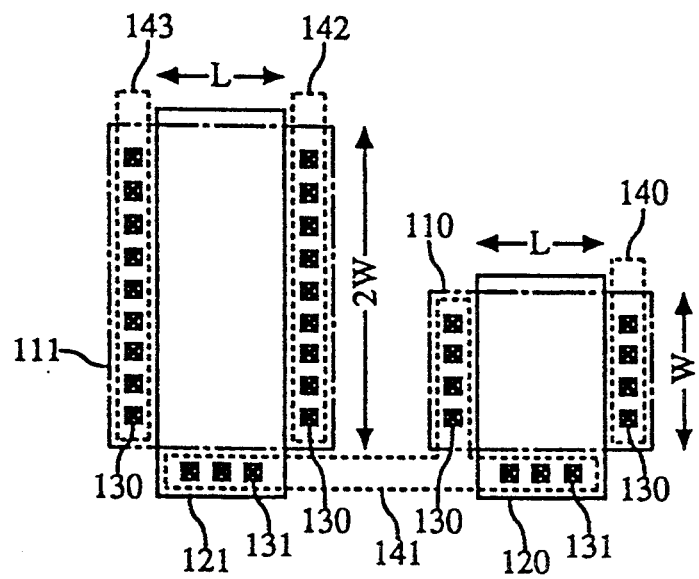
FIGS. 11(a), (b) are layout diagrams of a standard voltage generator used in the invention.
Figure 11B:
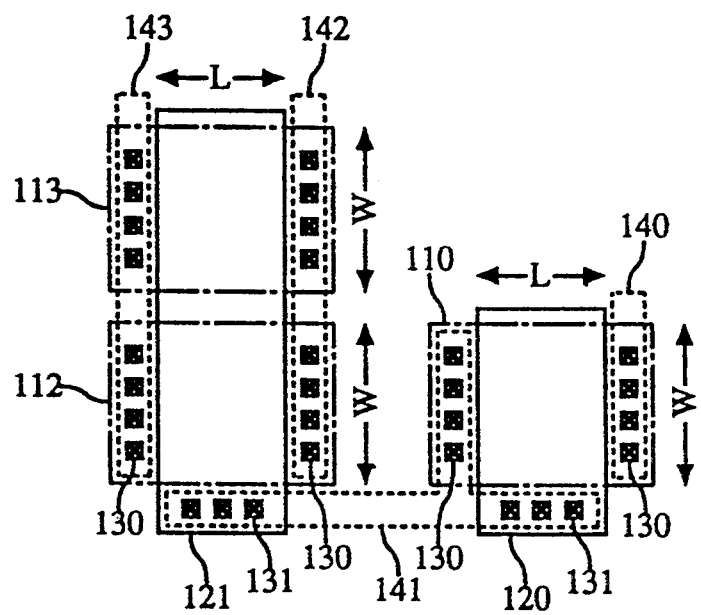

(1) The channel width W and the channel length L of each FET are made sufficiently large.
(2) Each FET is located in the proximity, and directions of currents flowing are made the same.
(3) When the current ratio is set to 1:1, the form of each FET is made identical.
(4) When the current ratio is set to n:1 (n is an integer not less than 2), the channel width is not made n times but n pieces of FETs having equal channel width are connected in parallel. This is to eliminate the influences of the difference between the design value and the finished value of the channel width. For example, when the current ratio is made 2:1, the layout in FIG. 11(b) is preferable to the layout in FIG. 11(a).

Figure 12A:
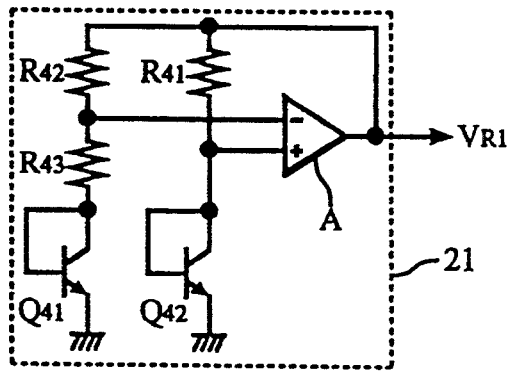
FIGS. 12(a), (b) are circuit diagrams of still further standard voltage generator used in the invention.
Figure 12B:
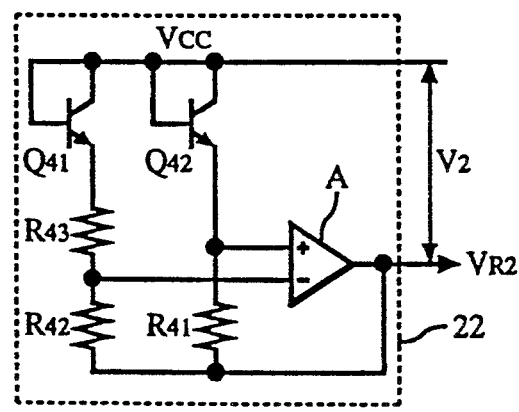

FIGS. 12(a) and (b) show a standard voltage generator of a socalled band gap system, containing NPN bipolar transistors Q41 and Q42, resistors R41-R43, and a differential amplifier A. FIG. 12(a) can be used as a standard voltage generator 21, and FIG. 12(b) can be used as a standard voltage generator 22. These circuits are characterized by a smaller temperature dependency of the standard voltage.

Figure 13A:
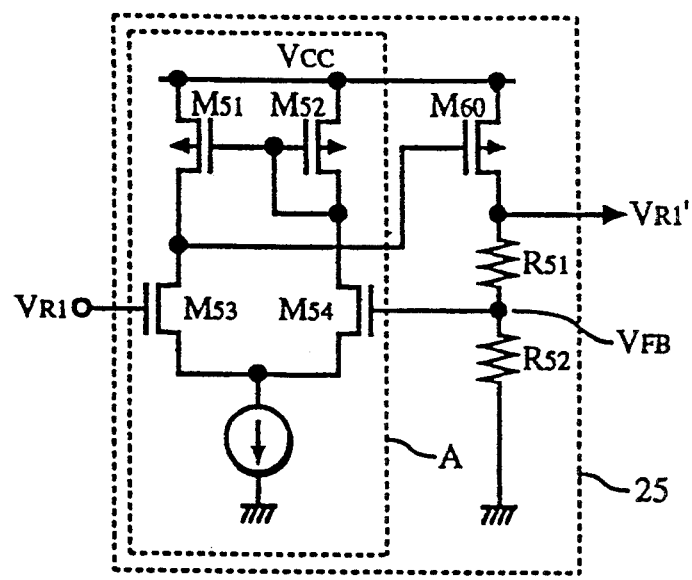
FIGS. 13(a), (b) are circuit diagrams of booster circuits used in the invention.

Next, a booster circuit used in the present invention will be explained. FIGS. 13(a) and (b) show examples of booster circuits. FIG. 13(a) shows a circuit which can be used as a booster circuit 25. This circuit is constituted by two amplification stages, a differential amplifier A comprising MOSFETs M51-M54, and an output stage comprising MOSFET M60 and two resistors R51, R52. Further, the voltage VFB derived from dividing output VR1' by the resistors R51, R52 is fed back to the differential amplifier A. As the feedback ratio is equal to R52/(R51+R52), the relation between the input voltage and the output voltage becomes $VR1' = VR1(R51+R52)/R52$. The circuit in FIG. 13(b) can be obtained by reversing all the polarities of the MOSFETs of this circuit and reversing Vcc and Vss. This circuit can be used as a booster circuit 26. The relation between the input voltage and the output voltage is expressed by the following equation $-V2' = -V2(R53+R54)/R54$.

Figure 14:
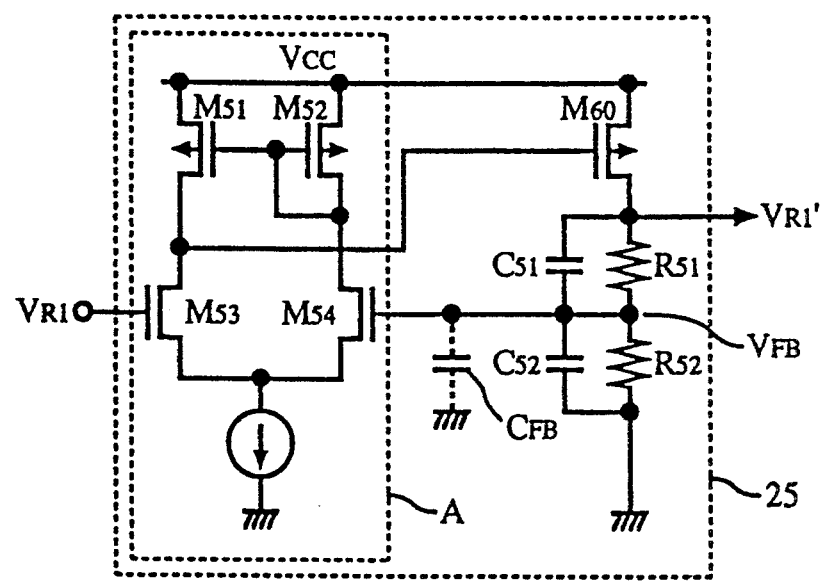
FIGS. 14(a), (b) are circuit diagrams of further booster circuits used in the invention.
Figure 14:
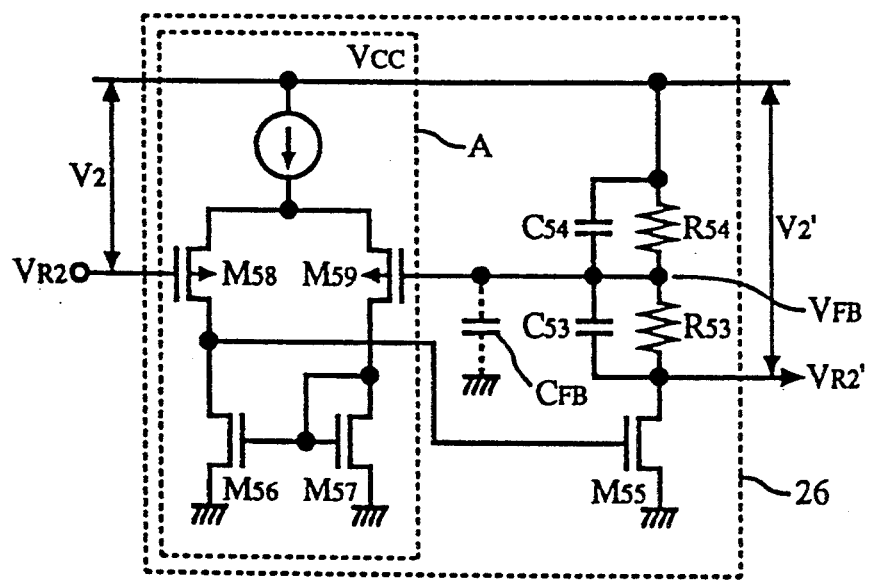

FIGS. 14(a), (b) show another example of a booster circuit. The difference from FIGS. 13(a), (b) is that capacitors C51 and C52 are inserted in parallel to resistors R51 and R52. These perform the role of speeding up the operation feedback. This will be explained regarding the circuit of FIG. 14(a).

Figure 15A:
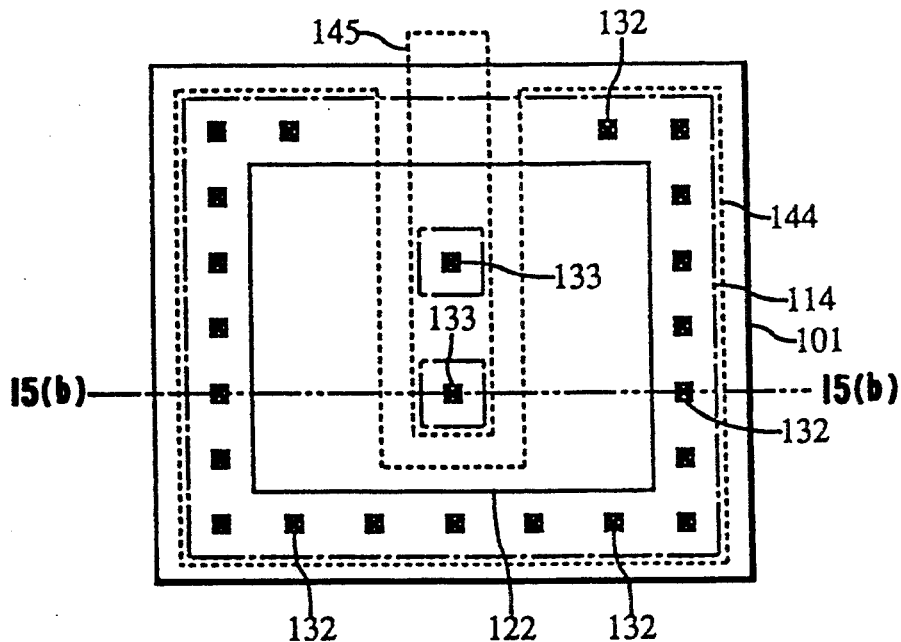
FIGS. 15(a), (b) are a plan view and a sectional view of a capacitor used in the invention.
Figure 15B:
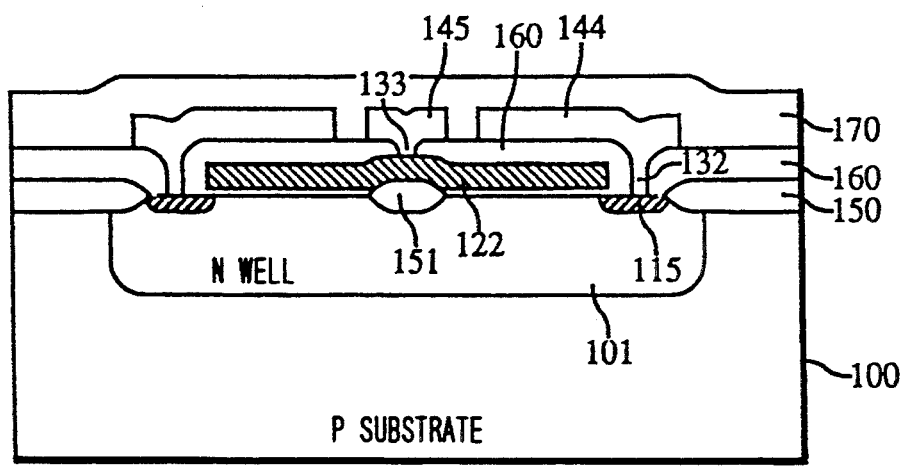

There is a delay due to the resistor R51 and a parasitic capacitance $C_{FB}$ of the feedback node in the feedback circuit from the output VR1' to the differential amplifier A. Owing to this, the change of the output VR1' is transferred to the input end with a time-lagging corresponding to the time constant $R51 \cdot C_{FB}$. According to known feedback amplifier theory, it is not preferable to have any time lagging in the feedback circuit. Since this makes the operation of an amplifier unstable. Reducing the ohmic value of the resistors R51 and R52 in order to decrease the lagging time constant, however, results in an increase of the consumed current. The change of the output VR1' can be transferred at higher speed by insertion of the capacitors C51 and C52 causing the division of capacitance. Accordingly, the operation of the amplifier can be stabilized without increasing the consumed current. The value of the capacitor is desirable to be made sufficiently larger than the parasitic capacitance $C_{FB}$. Still, the voltage derived from dividing the output VR1' by the resistors R51 and R52 is recommended to be approximately equal to the voltage divided by the capacitors C51 and C52. That is, it follows that R51: R52=1/C51:1/C52. For example, the capacitors having the constructions shown in FIGS. 15(a), (b) may be used as capacitors C51 and C52.

Figure 13B:
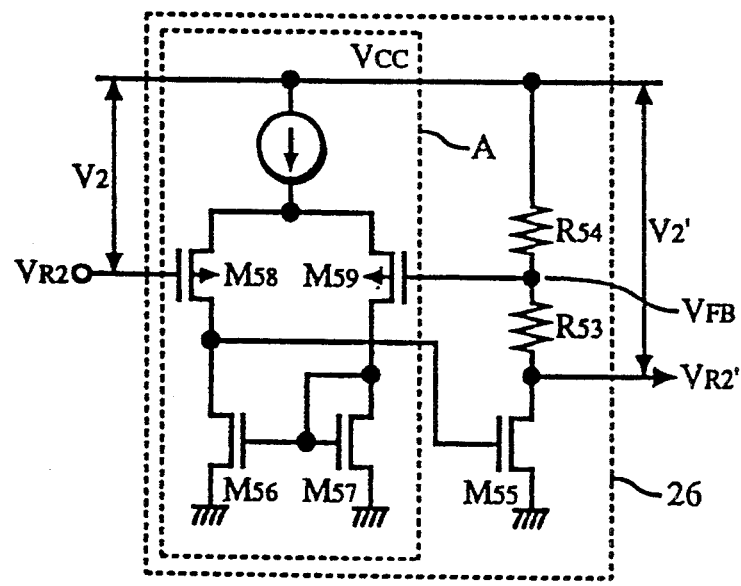
Figure 16:
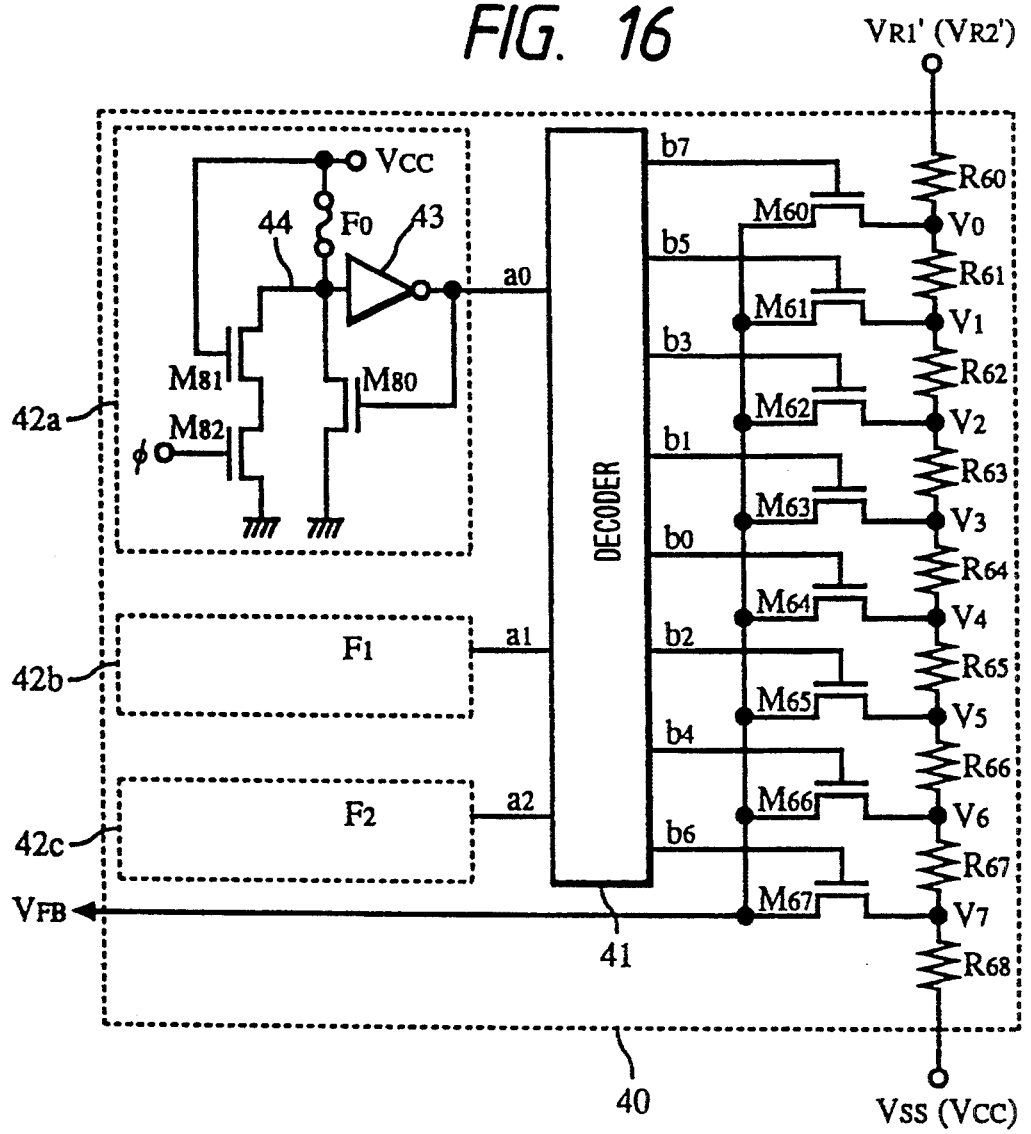
FIG. 16 a circuit diagram of a trimmer circuit used in the invention.

Since the feedback ratios are fixed in the circuits of FIGS. 13(a), (b) and FIGS. 14(a), (b), the ratios of input voltage to output voltage are fixed. If they are made variable, the trimming becomes possible. One method of making the feedback ratio variable is shown in FIG. 16. A circuit 40 comprises a decoder 41, resistors R60-R68, N-channel MOSFETs M60-M67, fuse ROMs 42a, 42b, 42c, fuse Fi (i=0-2), N-channel MOSFETs M80-M82 and an inverter 43. If the resistors R51, R52 in FIG. 13(a) are replaced by this circuit 40, a circuit to be used as a booster and trimming circuit 27 can be obtained. Also, if the resistors R53, R54 in FIG. 13(b) are replaced by the circuit 40, a circuit to be used as a booster and trimming circuit 28 can be obtained. The case of replacing the resistors R51, R52 in FIG. 13(a) will be explained as follows.

Figure 17:
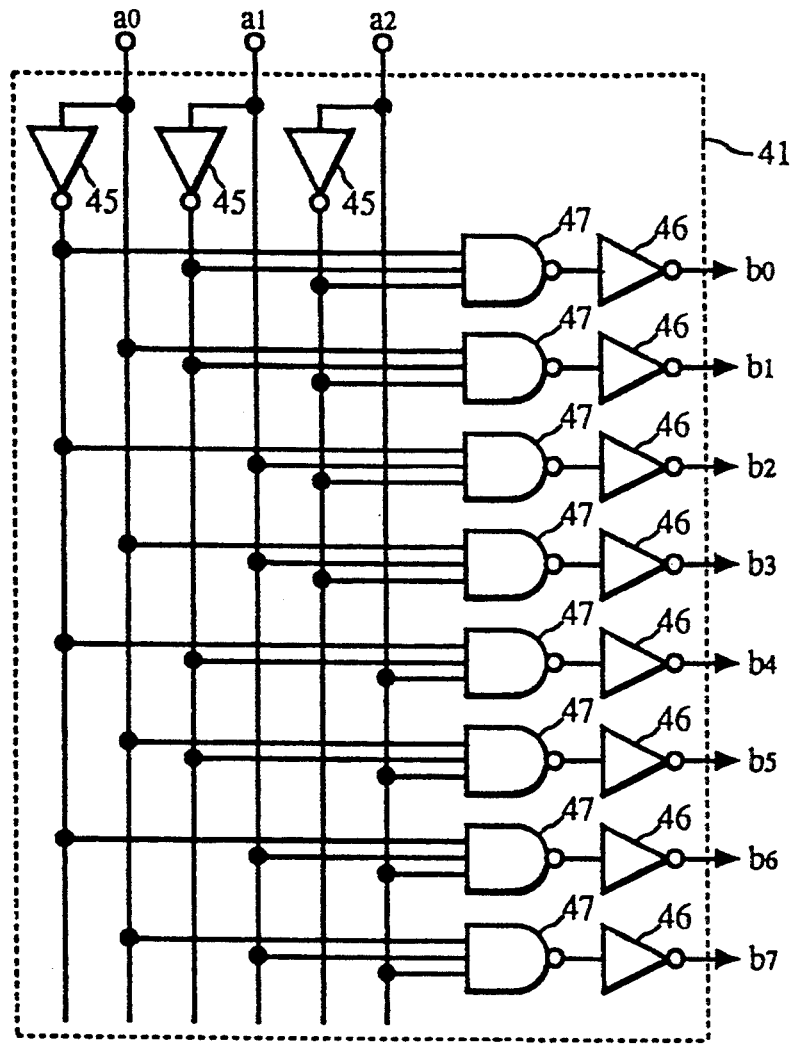
FIG. 17 is a circuit diagram of a decoder circuit used in the invention.

One of the voltages V0–V7 derived from the resistor-division of the output voltage VR1' is selected by the MOSFET group M60–M67 performing the role as switches, and becomes the feedback voltage $V_{FB}$. The decoder 41 controls this selection. That is, among output signals bo-b7 of the decoder, since only one is at high level and others are at low level, only the MOSFET having a high level applied to its gate is conductive and the others are not conductive. A circuit shown in FIG. 17 for example may be used as a decoder.

Figure 18:
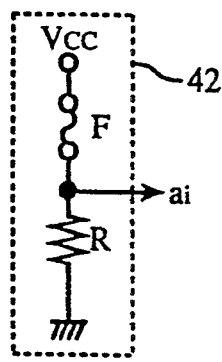
FIG. 18 is a circuit diagram of a fuse ROM used in the invention.

Input signals ao-a2 of the decoder 41 are outputs of the fuse ROMs 4a-4c, respectively. The fuse ROMs are circuits generating outputs in the form of a high or low voltage indicative of whether or not the fuses are disconnected and are used for programming the way of trimming as hereinafter described. In an example shown in FIG. 16, when the fuse Fi is not disconnected, a node 44 being connected through the fuse to the power source Vcc results in high level, the output ai is at low level and, therefore, the MOSFET M80 becomes nonconductive. On the contrary, when the fuse Fi is disconnected, the node 44 is at low level and the output ai is at high level. Accordingly, the MOSFET M80 becomes conductive and latches the node 44 to a low level. Further, the MOSFETs MS1, M82 are used to initialize this latch (when a fuse is disconnected, the node 44 is made a low level). Signal $\phi$ applied to the gate of the MOSFET M82 may be, for example, a signal which comes to a high level only when the power supply is switched on. Otherwise, a signal becoming a high level not only at the supply time but also at a suitable time may be used. For example, when the present invention is applied to a memory LSI, a signal becoming a high level at the beginning of the cycle can be used. A circuit composed of a fuse F and a resistor R as shown in FIG. 18 may be used as a fuse ROM. But the latch circuit as shown in FIG. 16 has the advantage that it is rather resistant to external noise and also, current does not flow during the normal time.

The feedback voltage $V_{FB}$ can be programmably selected from among Vo-V7, according to whether or not the fuses Fo, F1 and F2 in the fuse ROM are, disconnected respectively. For example, only Fo may be disconnected in order to select V3. At this time, ao becomes high level and a1 and a2 become low level. Further, among output signals of the decoder, only b1 becomes high level and others become low level. Then, only MOSFET M63 is turned on and others are turned off, and V3 is selected. When the feedback ratio is made larger (for example, Vo is selected), the output voltage VR1' becomes lower, and when the feedback ratio is made smaller (for example, V7 is selected), VR1' becomes higher. For carrying out the trimming, first of all, the voltage $V_{R1}$ or VR1' is measured before fuses are disconnected, and the trimming method is determined so that VR1' after the trimming becomes a desired voltage, and then the above process may be programmed. Voltage measuring pads are preferably provided for VR1 or VR1'.

This trimming method is characterized in that fine trimming can be done by a fewer number of fuses. Generally, the n fuses enable the trimmings the number of which is the n-th power of 2.

Figure 19:
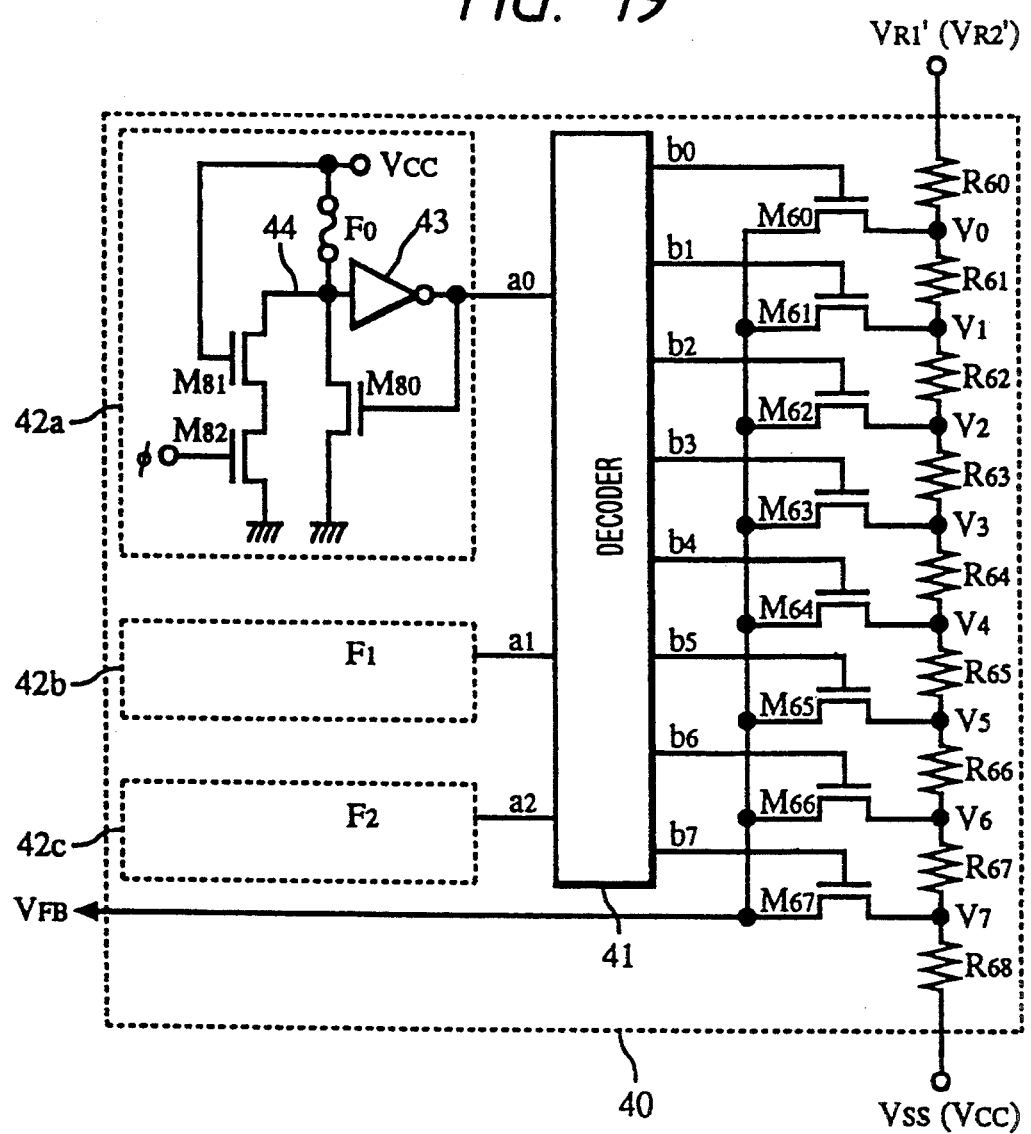
FIG. 19 is a circuit diagram of a trimmer circuit used in the invention.
Figure 27:
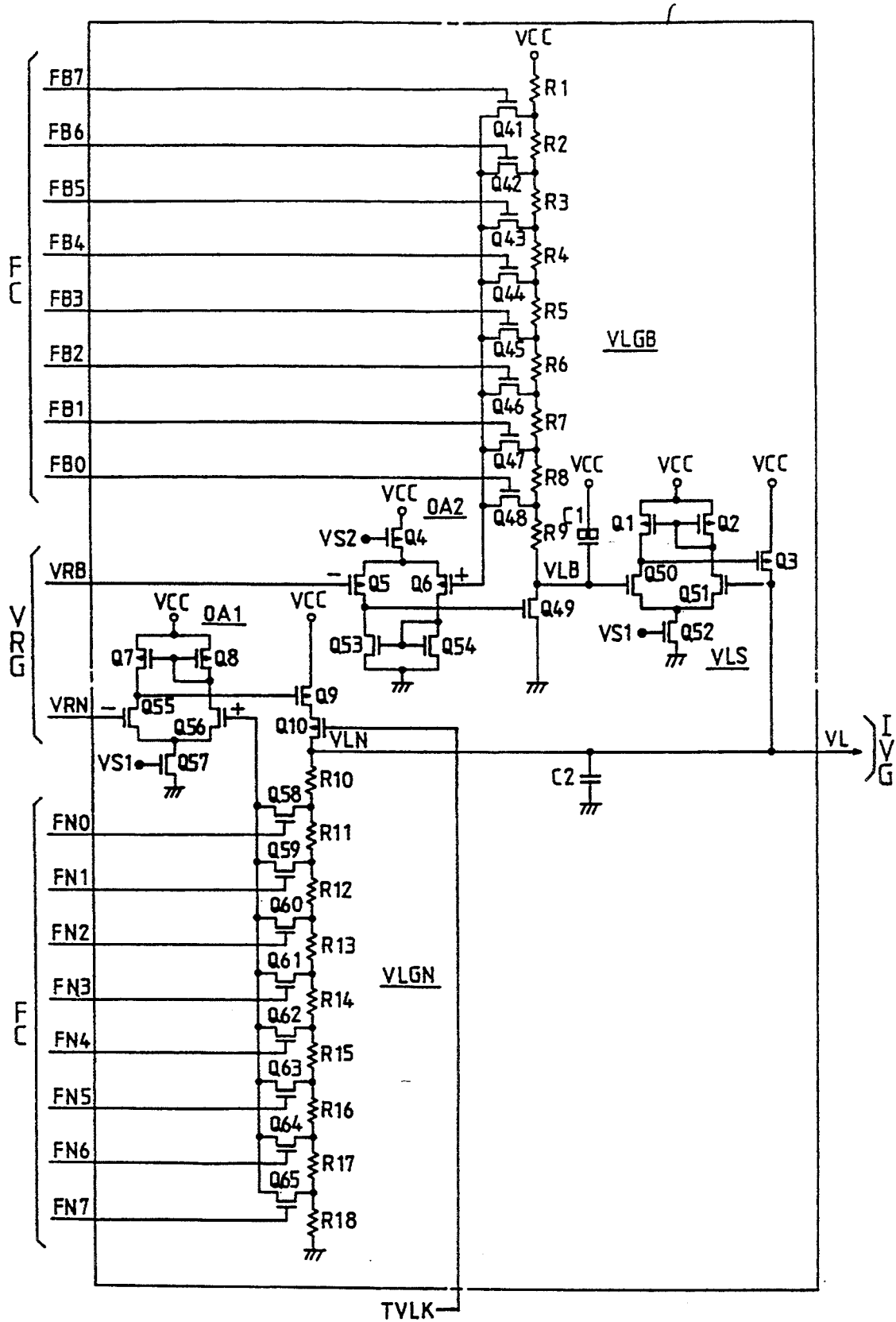
FIG. 27 is a circuit diagram showing an embodiment of a standard voltage generator being contained in a voltage conversion circuit of a dynamic type RAM to which the present invention has been applied.

In this embodiment, method of assigning the outputs bo-b7 of the decoder to the MOSFETs M60-M67 has been devised. Of course, a simple method of assigning in the order of the number is permissible as shown in FIG. 19. This is easy to be understood in a standpoint of trimming method, but an embodiment shown in FIG. 27 is more preferable in that the number of fuses to be disconnected diminishes as hereinafter explained.

The dispersion of the standard voltages can be substantially approximated by a normal distribution. That is, the nearer is the dispersion to the median, of them, the higher the frequency becomes, and the farther from the median, the lower the frequency becomes. Therefore, when trimmings are carried out, there are relatively many cases for V3 and V4 in the vicinity of median to be selected among Vo-V7, and there are few cases for both extremities Vo and V7 to be selected. On the other hand, the number of fuses to be disconnected in order to realize high levels of specific output signals of the decoder is as follows. Three fuses must be disconnected in order to make b7 high level. Two fuses must be disconnected in order to make b3, b5 or b6 high level, and one fuse must be disconnected in order to make b1, b2 or b4 high level. Any fuse need not be disconnected in order to make bo high level. Therefore, as shown in the embodiment of FIG. 16, it is possible to diminish the number of fuse disconnections on the standpoint of statistics. For example bo, b1, b2 and b4 having the small number of fuse disconnections are allocated to the vicinity of the center, and b7, b3, b5 and b6 having the large number of fuse disconnections are allocated to the extremities, respectively. Thereby, the time required for the trimming can be shortened and the test costs of LSI can be reduced.

Figure 20:
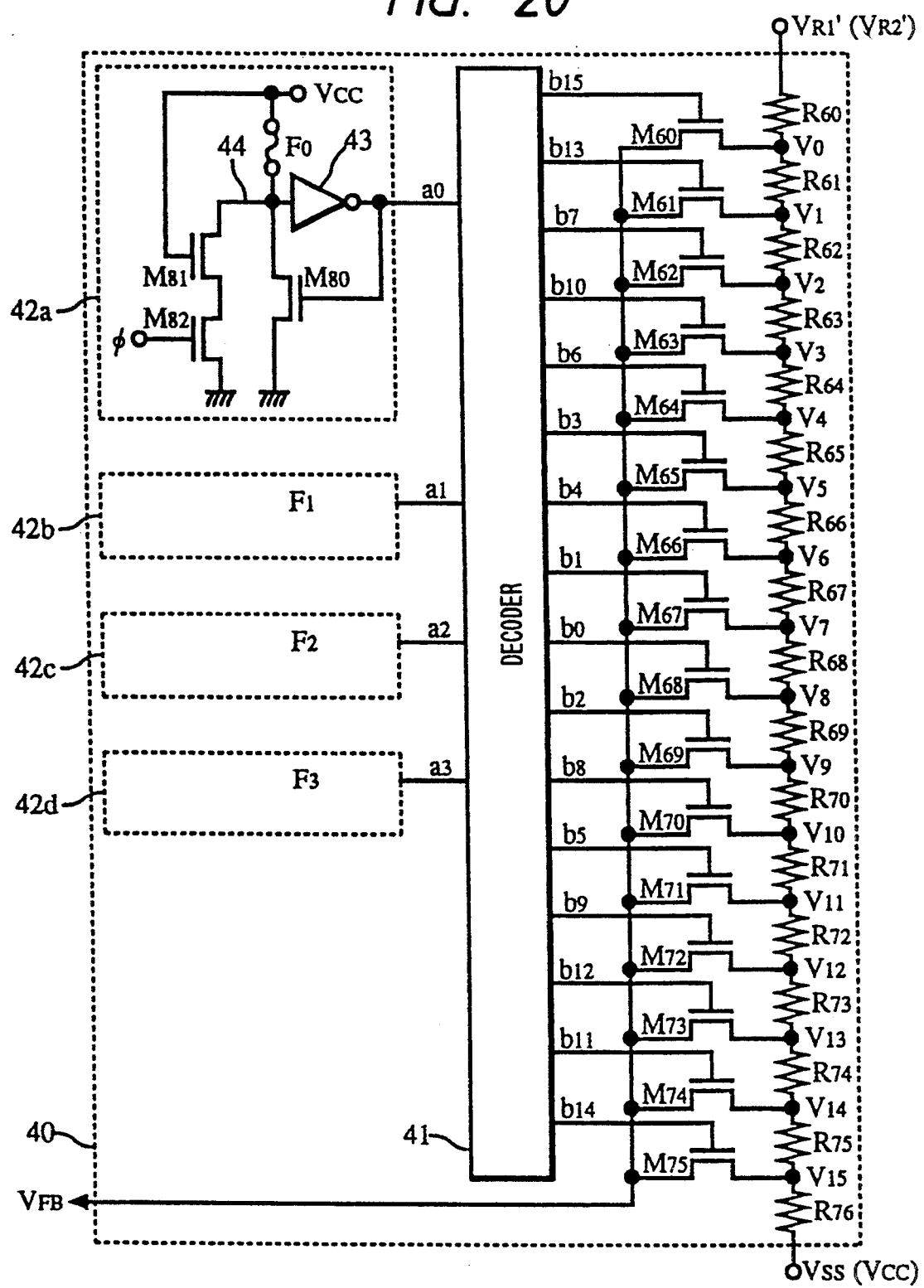
FIG. 20 is a circuit diagram of a trimmer circuit used in the invention.

An embodiment shown in FIG. 16 is a circuit allowing eight kinds of trimmings by three fuses. But, of course, the number of fuses may be varied according to what degree of trimmings shall be done precisely. FIG. 20 shows an embodiment which enables 16 kinds of trimmings using four fuses. In this embodiment, too, as in FIG. 16, a method of allocating the outputs bo-b15 of the decoder to the MOSFETs M60-M75 has been devised.

Figure 21:
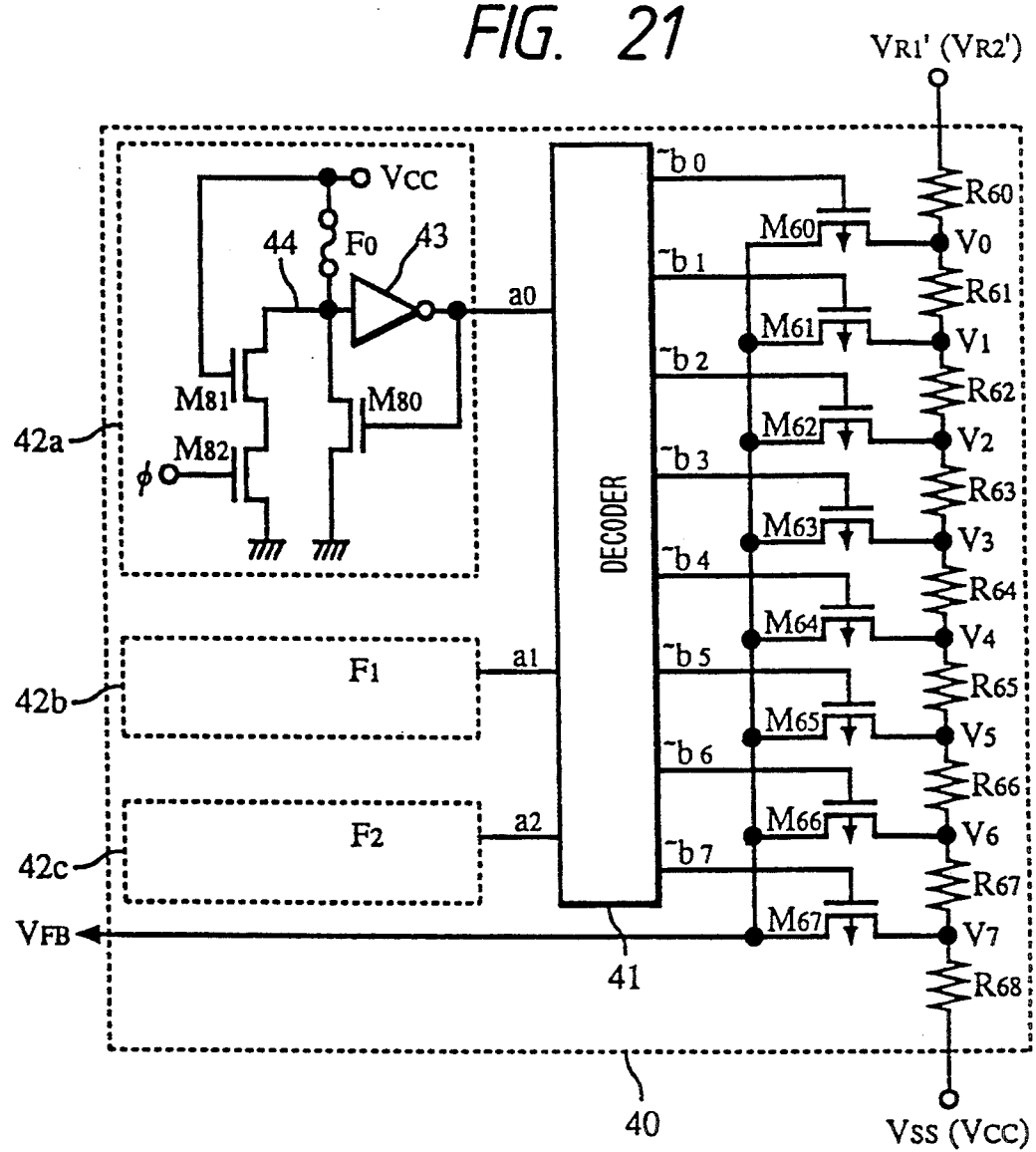
FIG. 21 is a circuit diagram of another trimmer circuit used in the invention.

FIG. 21 shows another embodiment of trimmer circuits. The difference from FIG. 16 is to use P-channel MOSFETs as MOSFETs M60-M67. Therefore, the output of the decoder 41 has been changed to a complementary signal. This trimmer circuit is suitable for the replacement of the resistors R53 and R54 in the booster circuit in FIG. 13(b) because the feedback voltage $V_{FB}$ is relatively high (nearly equal to Vcc). Contrarily, since $V_{FB}$ is relatively low (nearly equal to the earth or ground potential) in the circuit shown in FIG. 13(a), when the resistors R51 and R52 are replaced, the circuits using N-channel MOSFETs as shown in FIG. 16 are better.

Figure 22:
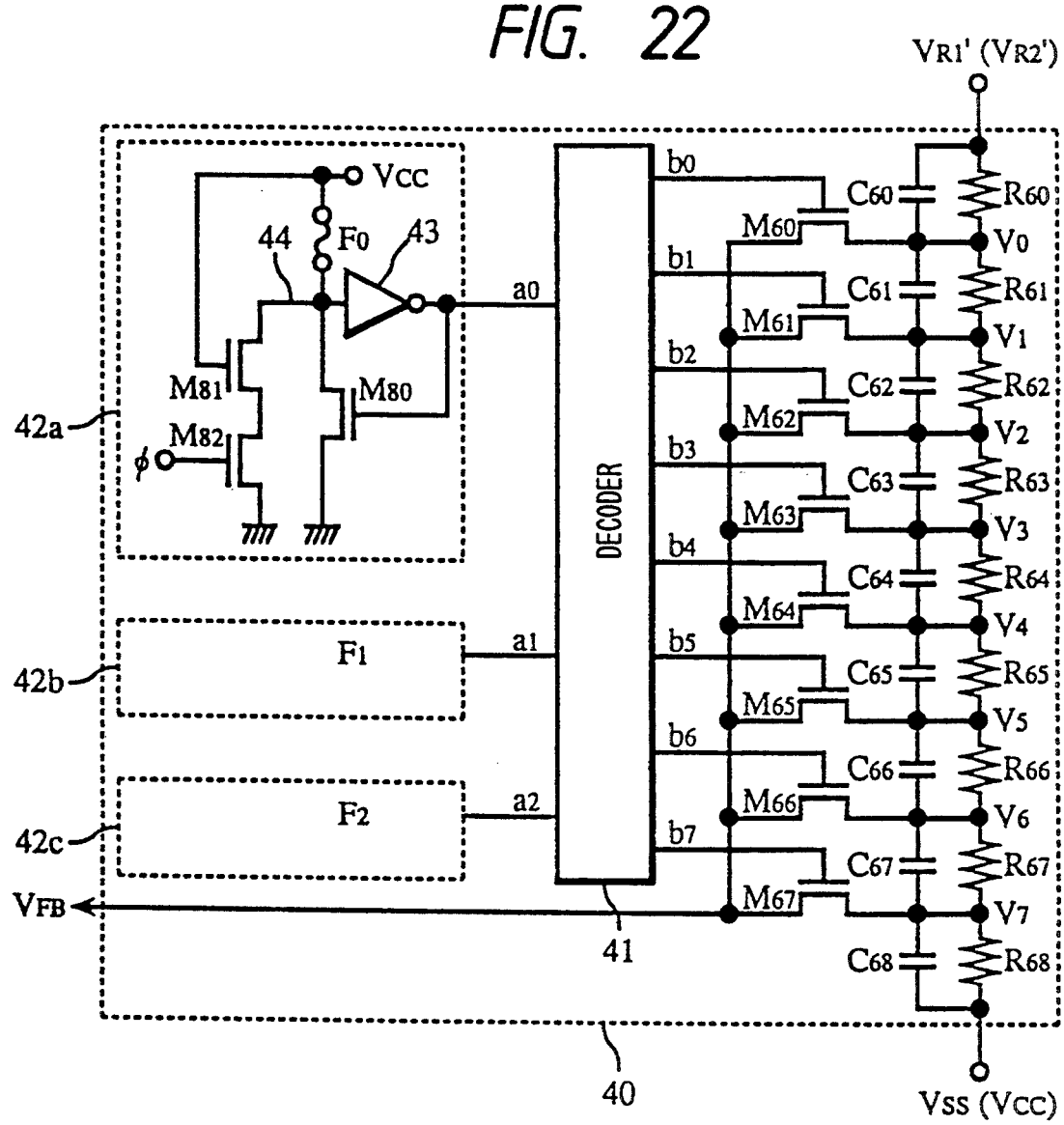
FIG. 22 is a circuit diagram of a still another trimmer circuit used in the invention.

FIG. 22 shows another embodiment of trimmer circuits. This circuit is characterized in that capacitors C60-C68 are connected in parallel to resistors R60-R68, respectively. These capacitors play the role of speeding up the feedback as well as C51 and C52 in FIG. 14(a). It is desirable to select the values of capacitance so that each voltage derived from dividing the output VR1' by the resistors and each voltage derived from dividing it by the capacitors may be approximately equal. That is to say, R60:R61: . . . :R68=1/C60:1/C61: . . . :1/C68.

Figure 23:
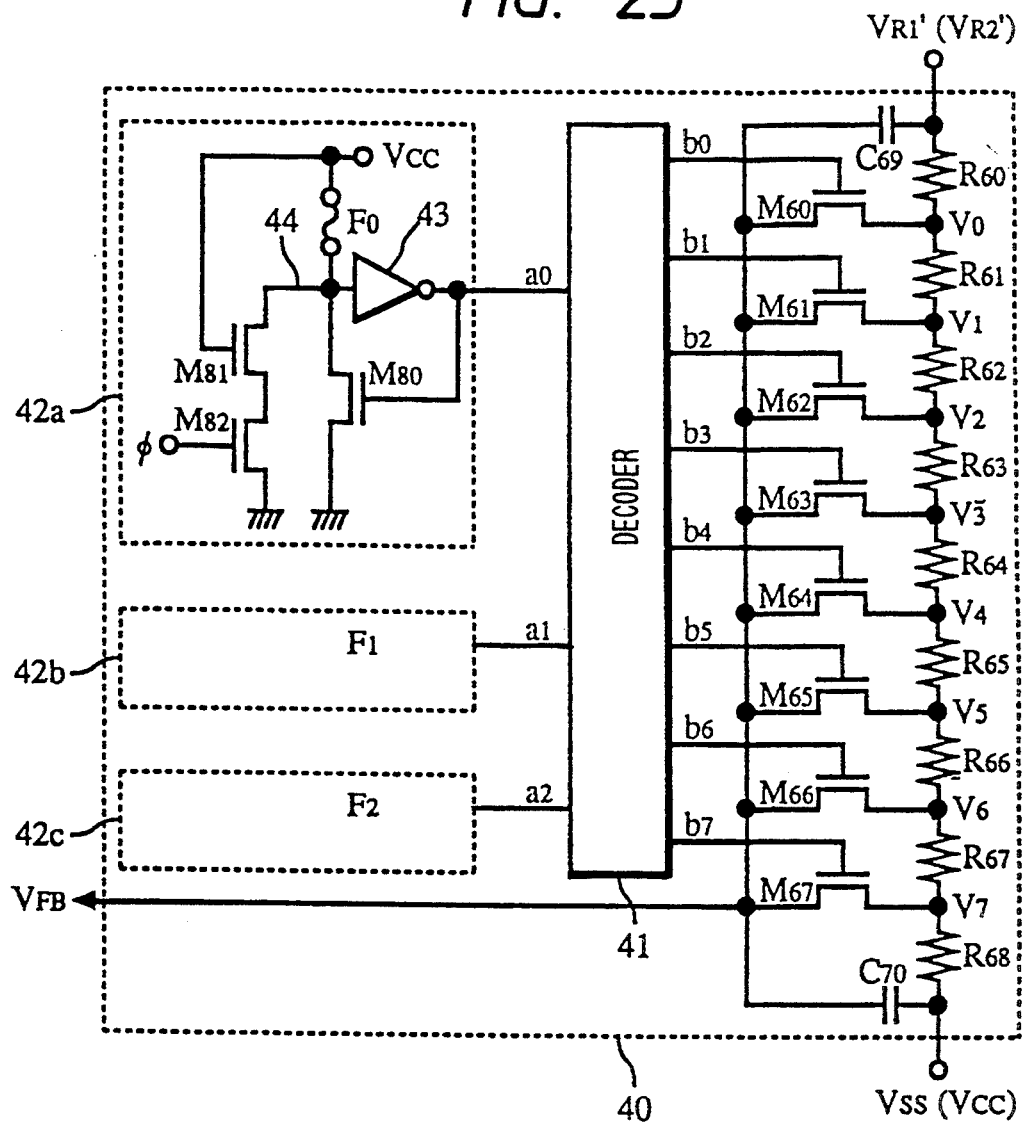
FIG. 23 is a circuit diagram of a further trimmer circuit used in the invention.

FIG. 23 shows another embodiment of trimmer circuits. Capacitors C69 and C70 are connected to this circuit, too, as is the case in the embodiment shown in FIG. 22, for speeding up the feedback. The values of capacitance of the capacitors C69 and C70 are set to such values that the voltage derived from dividing the output VR1' by the capacitors C69 and C70 is equal to the voltage in the vicinity of the center between Vo and V7, for example V4. That is, (R60+R61+R62+R63+R64):(R65+R66+R67+R68)=1/C69:1/C70. This embodiment is characterized by the occupied area becoming smaller than that of the embodiment in FIG. 22. As many capacitors are necessary as are resistors in the embodiment of FIG. 22. Further, capacitances of the capacitors C61–C67 must be made sufficiently larger than that of the capacitors C60 and C68. This is because the trimmer circuit is for fine adjustment of the feedback ratio, and it is conventional that resistances of the resistors R61–R67 are sufficiently smaller than those of the resistors R60 and R68 on both ends. This means the increase of the occupied area. On the other hand, in this embodiment, capacitors C61–C67 requiring large areas are unnecessary. But, if the voltage other than V4 is selected by trimmings, the difference between the division by resistors and the division by capacitors takes place to some extent, but it is almost out of the question as resistances of the resistors R61–R67 are small.

Fuses to be disconnected by laser ray are used in the embodiment as the elements programming the trimming methods, but other elements may be used. For example, it is also possible to disconnect fuses electrically by adding the cutting circuits. Method of disconnecting by laser ray needs no disconnecting circuit and therefore has an advantage of reducing the occupied area, and electrical method has an advantage that usage of an expensive laser irradiation apparatus becomes unnecessary. Regarding the quality of the material of fuses, for example, polycrystalline silicon and silicide can be used. Especially, in case the present invention is applied to a semiconductor memory having defect protection circuit, addition of special process to to manufacture fuses becomes unnecessary if the same circuits as that used for the defect protection is utilized. Regarding program elements, non-volatile memories such as EPROM may be used in place of fuses.

Figure 24:
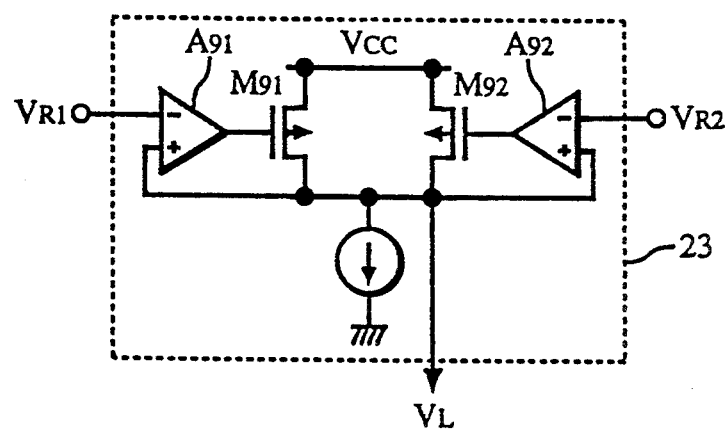
FIG. 24 is a circuit diagram of a selection circuit used in the invention.

Next, a selection circuit used in the present invention will be explained. FIG. 24 shows an example of a selection circuit which can be applied to the invention. A selection circuit 23 comprises differential amplifiers A91, A92, and P-channel MOSFETs M91, M92. Output voltage $V_L$ becomes equal to two input voltages $V_{R1}$ and $V_{R2}$, whichever the higher.

Figure 25:
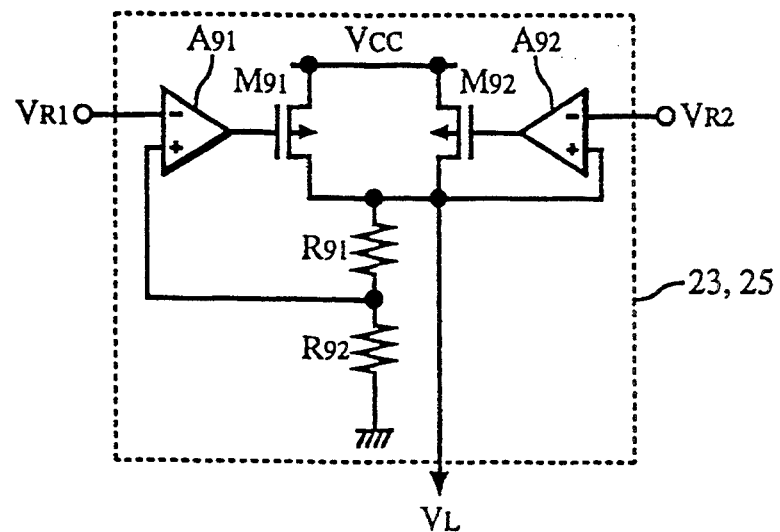
FIG. 25 is a selection and booster circuit used in the invention.

The present invention may adopt a circuit which serves both as a booster circuit or a booster/trimming circuit and as a selection circuit. FIG. 25 shows an example of a circuit which serves both as a booster circuit 25 and as a selection circuit 23. In this circuit, the output voltage $V_L$ is fed back directly to the differential amplifier A92, but voltage $V_{FB}$ derived from the output voltage $V_L$ divided by resistors R91 and R92 is fed back to the differential amplifier A91. Therefore, the output voltage $V_L$ becomes equal to the voltage $V_{R1}(R91+R92)/R92$ where the voltage VR1 is boosted or the voltage VR2 itself, whichever is the larger. Moreover, trimmings are rendered possible by replacing the resistors R91 and R92 of this circuit by the circuit 40 shown in FIG. 16 or FIGS. 19–23. That is, the circuit which serves both as a booster/trimming circuit 27 and as a selection circuit 23 can be made. Occupied area on the semiconductor chip and the consumed power can be reduced by adopting the circuit which serves both as such a booster circuit or a booster/trimming circuit and as a selection circuit.

Although the present invention has been explained according to embodiments, it is not limited these embodiments. For example, the embodiments assume that they can be applied to a semiconductor device using a CMOS technique, but the present invention can be applied to the other techniques, for example, monopolarity MOS transistor, bipolar transistor or semiconductor devices using those combinations.

Figure 26:
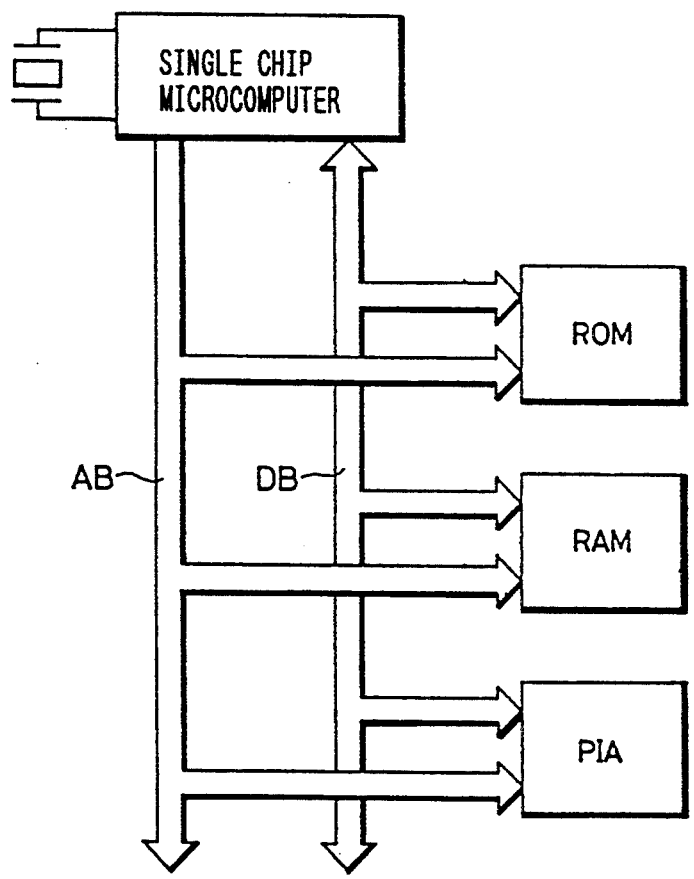
FIG. 26 is a block diagram of a microcomputer system being constituted by using a ROM in the invention.

FIG. 26 shows microcomputer system using random access memory RAM to which the present invention is applied. A single chip microcomputer is coupled through an address bus AB and a data bus DB to peripheral devices such as a read only memory ROM, a peripheral interface and an adapter PIA and to a random access memory RAM related to the present invention.

Figure 28A:
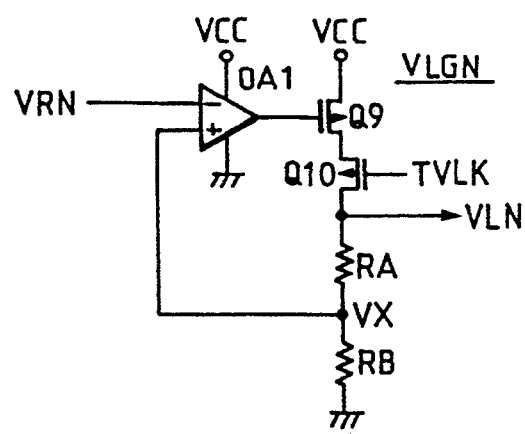
FIGS. 28(a), (b) are partial equivalent circuit diagram showing an example of a standard voltage generator in FIG. 27.
Figure 28B:
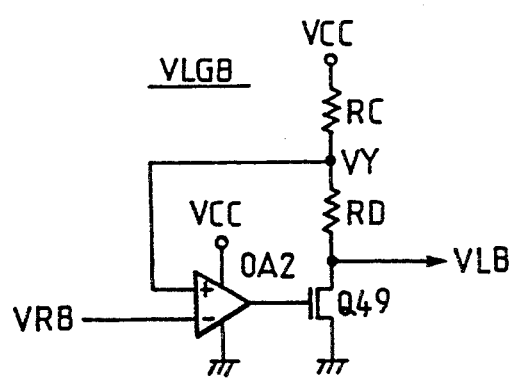
Figure 29:
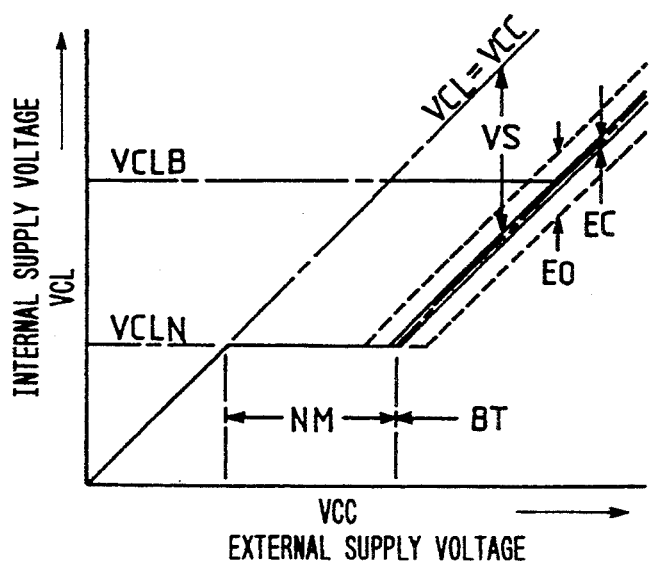
FIG. 29 is an output characteristics diagram showing an embodiment of a voltage conversion circuit including a standard voltage generator in FIG. 27.
Figure 35:
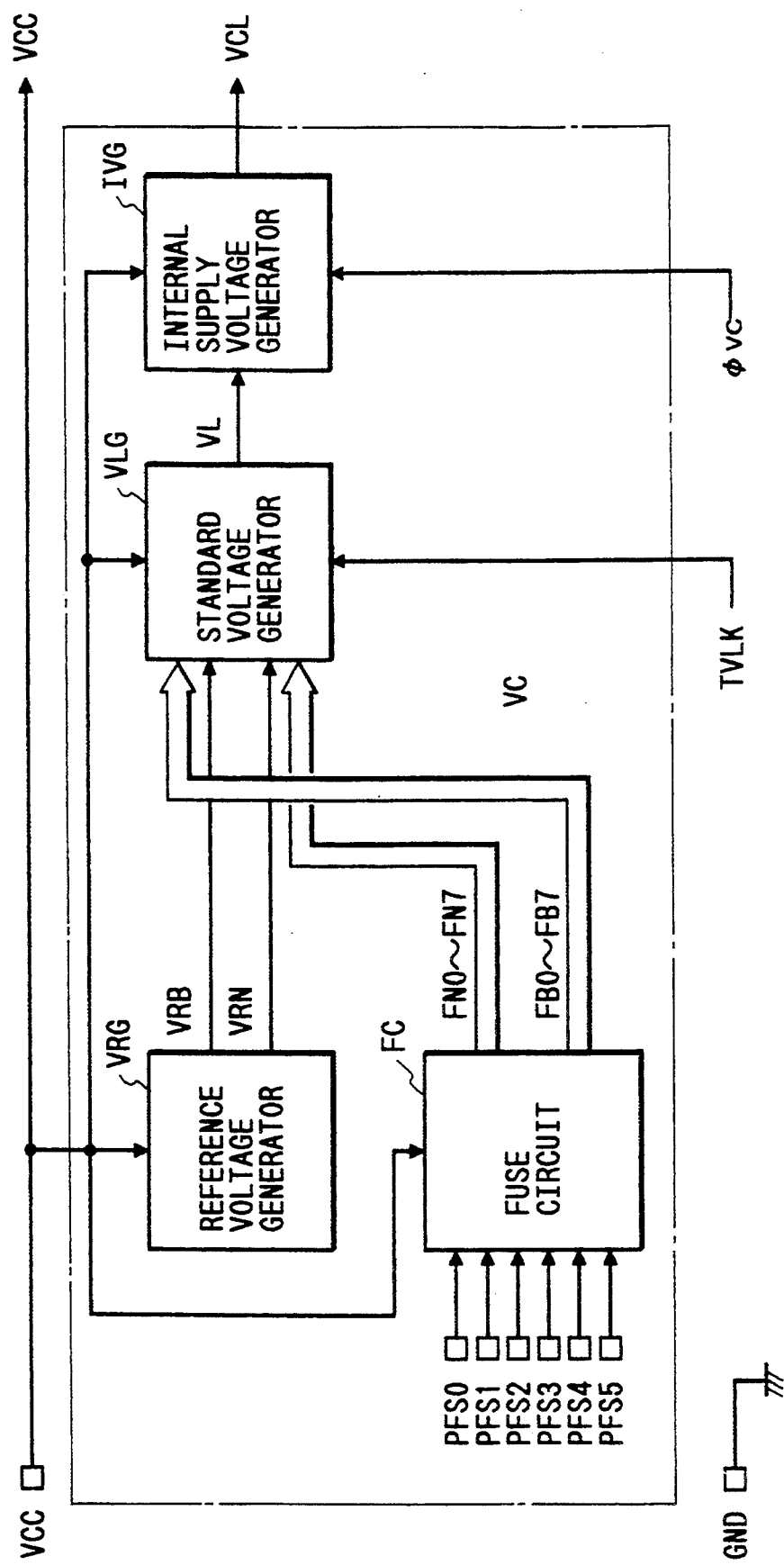
FIG. 35 is a block diagram showing an embodiment of a voltage conversion circuit of dynamic type RAMs to which the present invention has been applied.
Figure 36:
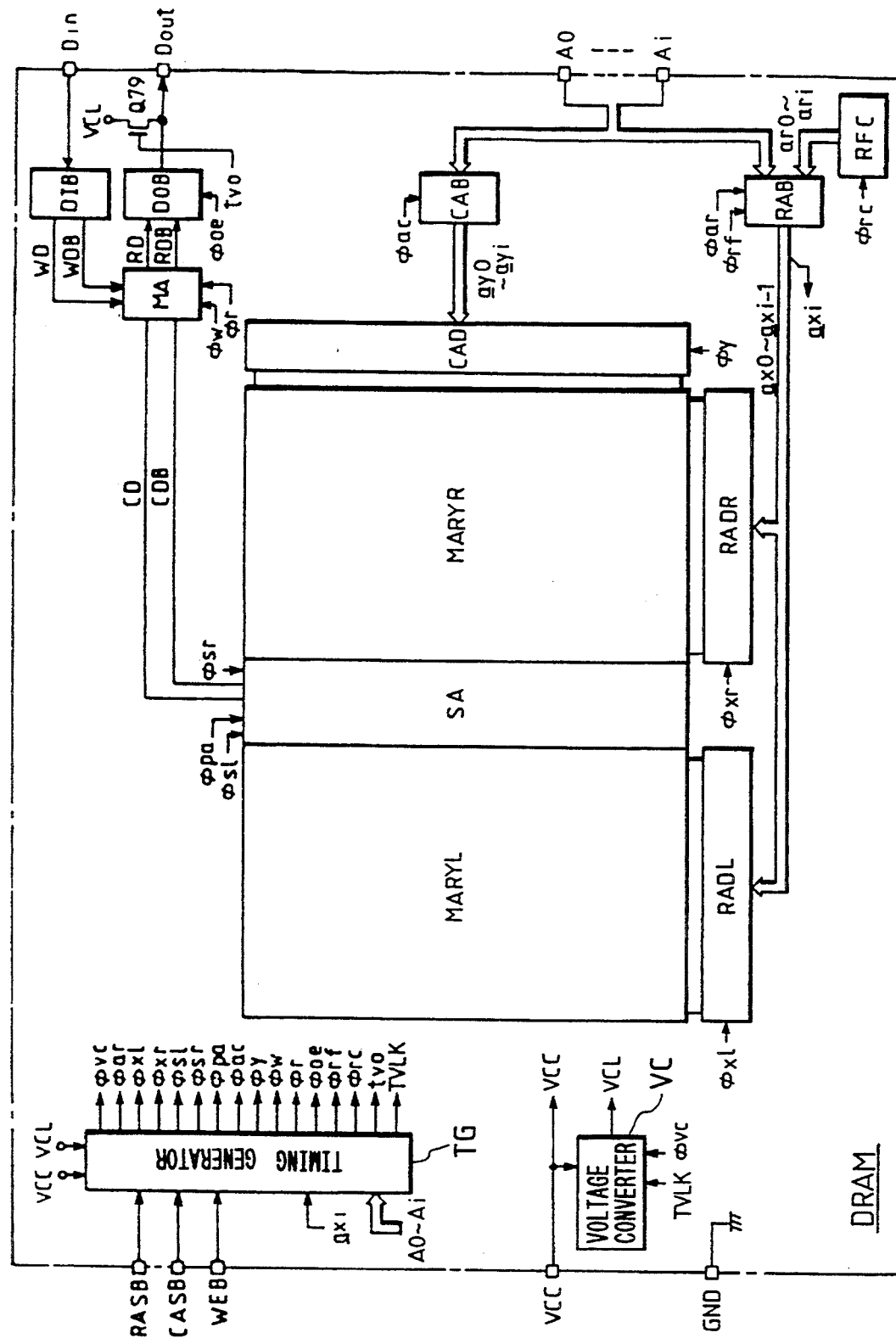
FIG. 36 is a block diagram showing an embodiment of a voltage conversion circuit of dynamic type RAMs to which the present invention has been applied.

FIG. 36 shows a block diagram of an embodiment of dynamic type RAMs o which the present invention is applied. FIG. 35 shows a block diagram of an embodiment of voltage conversion circuit VC contained in the dynamic type RAM in FIG. 36, and FIG. 27, FIG. 32, FIG. 33 and FIG. 34 show circuit diagrams of an embodiment of a standard voltage generator VLG, a reference voltage generator VRG, a fuse circuit FC and an internal supply voltage generator IVG respectively included in the voltage conversion circuit VC of FIG. 35. Further, FIG. 28 shows an example a partial equivalent circuit diagram of the standard voltage generator VLG in FIG. 27, and FIG. 29 shows output characteristics of the embodiment. Based on these drawings, the constitution of the dynamic type RAM and the voltage conversion circuit and the outlines of their operations and characteristics as well as their features will be explained.

Figure 37:
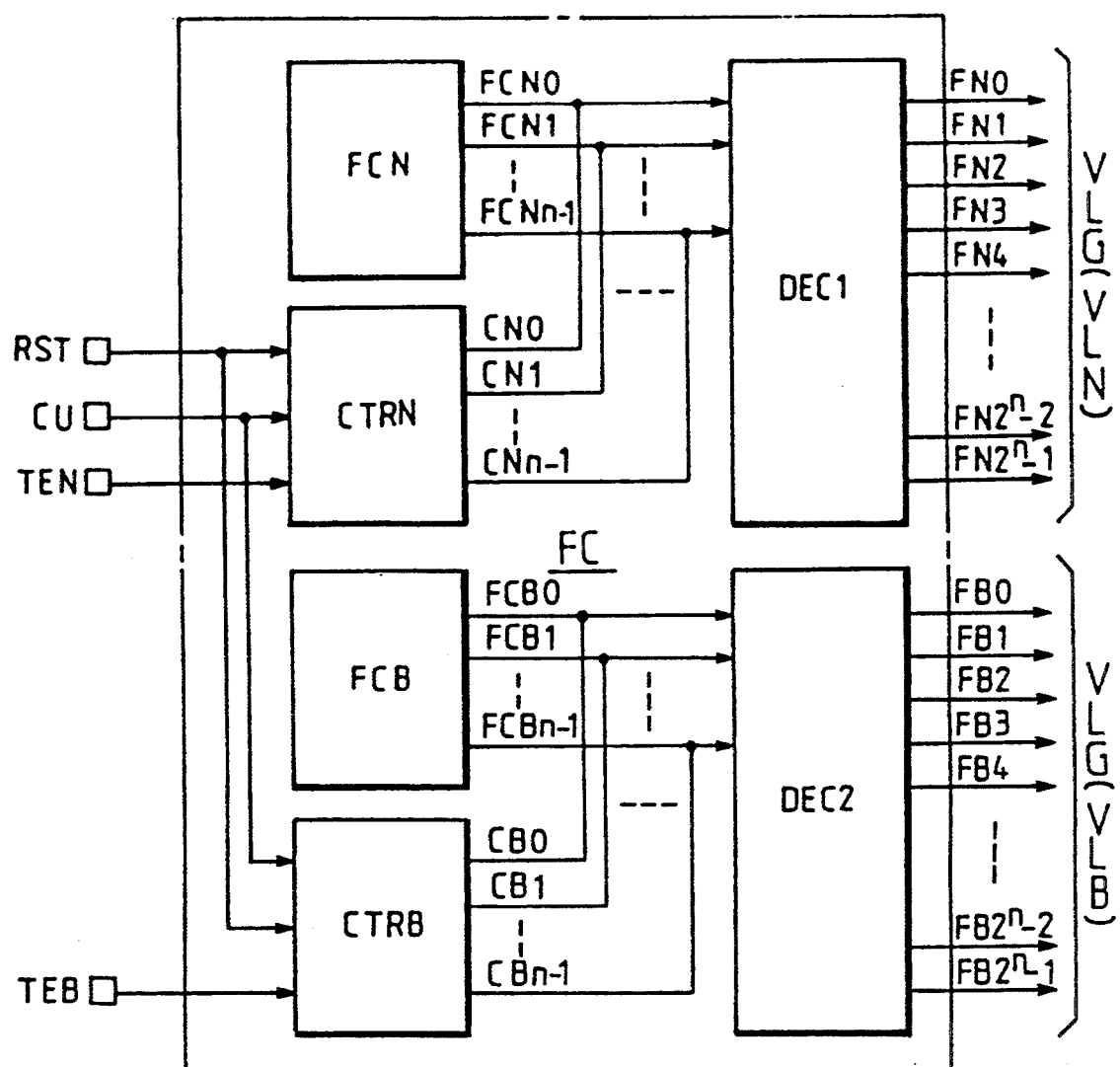
FIG. 37 is a block diagram showing another embodiment of a fuse circuit contained in a voltage conversion circuit of dynamic type RAMs to which the present invention has been applied.

Further, circuit elements shown in FIG. 27, FIG. 28 FIGS. 32 through 34 as well as circuit elements constituting each block in FIGS. 35 through 37 are formed on a semiconductor board such as monocrystalline silicon by the widely known manufacturing technique of semiconductor integrated circuit. In the following circuit diagrams, MOSFET (metal oxide semiconductor field effect transistor, MOSFET being a general term of insulated gate type field effect transistors in this specification) with arrow on the channel (back gate) part is P-channel type, and distinguished from N-channel MOSFET with no arrow.

Dynamic type RAMs of this embodiment have relatively large memory capacities, and circuit elements become very smaller, memory cells being centered, and their dielectric strengths are low. Therefore, internal circuits of dynamic type RAMs containing memory arrays have internal power supply voltage VCL of $+3.3$ V as their power source for operation. The dynamic type RAMs contain a voltage conversion circuit VC forming the above internal supply voltage VCL based on external supply voltage Vcc of $+5.0$ V. Thereby dielectric breakdown of the circuit elements is prevented, and reduction of power consumption of the dynamic type RAMs as well as unification of external supply voltage are planned.

In FIG. 36, dynamic RAMs adopt so-called shared sense system and a pair of memory arrays MARYL and MARYR positioned through a senseamplifier SA are their fundamental construction.

The memory arrays MARYL and MARYR comprise a plurality of word lines arranged in parallel to the vertical direction of the drawing, plural sets of complementary bit lines arranged in parallel to the horizontal direction, and many dynamic type memory cells arranged like latticework on the cross points of these word lines and complementary bit lines, respectively.

The word lines constituting the memory arrays MARYL and MARYR are coupled with corresponding row address decoders RADL and RADR respectively and made the selection condition alternatively. Complementary internal address signals ax0–axi−1 of i bit excluding the most significant bit from a row address buffer RAB are commonly supplied to the row address decoders RADL and RADR (Here, for example, non-inverted internal address signal ax0 and inverted internal address signal ax0B are combined and expressed as complementary internal address signal ax0. Inverted signal is expressed by signal name with B added to its tail end such as inverted internal address signal ax0B. The same shall apply hereinafter.), and timing signal $\phi xl$ and $\phi xr$ are supplied respectively from a timing generator TG. Also X Address signals AX0–AXi are supplied in the time sharing manner through address input terminals A0–Ai to a row address buffer RAB, and refresh address signals ar0–ari are supplied from a refresh address counter RFC. Further, timing signals $\phi ar$ and $\phi rf$ are supplied from a timing generator TG to the row address buffer RAB, and a timing signal $\phi rc$ is supplied to the refresh address counter RFC.

The timing signal $\phi xl$ is made high level, thereby the row address decoder RADL is made operating condition selectively. In this operating condition, the row address decoder RADL decodes the complementary internal address signals ax0–axi−1, and the corresponding word lines of the memory array MARYL are alternatively made selection condition of high level. Similarly, the timing signal xr is made high level, thereby the row address decoder RADR is made operating condition selectively, and the corresponding word lines of the memory array MARYR are alternatively made selection condition of high level according to the complementary internal address signals ax0–axi−1.

When the dynamic type RAM is made normal normal operation mode and the timing signal $\phi rf$ is made low level, according to the timing signal $\phi ar$, the row address buffer RAB incorporates the X address signals AX0–AXi supplied in the time sharing manner through the address input terminals A0–Ai. Also when the dynamic type RAM is made refresh mode and the timing signal rf is made high level, it incorporates the refresh address signals ar0–ari supplied from the refresh address counter RFC. The complementary internal address signals ax0–axi are formed based on these row address signals. Among the above signals, the complementary internal address signal axi of the most significant bit is supplied to the timing generator TG, and other complementary internal address signals ax0–axi−1 are supplied commonly to the row address decoders RADL and RADR as stated above.

When the dynamic type RAM is made refresh mode, the refresh address counter RFC performs a stepping operation according to the timing signal $\phi rc$, and forms the refresh address signals ar0–ari and supplies them to the row address buffer RAB.

On the other hand, complementary bit lines constituting the memory array MARY are coupled through corresponding shared MOSFET of a sense amplifier SA with corresponding unit amplifier circuit of the sense amplifier SA. Complementary input/output nodes of these unit amplifier circuits are further coupled through a pair of corresponding switch MOSFETs with complementary common data lines CD respectively. The timing signals $\phi sl$ or $\phi sr$ are supplied commonly to a shared MOSFET of the sense amplifier SA, and the internal supply voltage VCL and the earth potential are supplied selectively to the unit amplifier circuit through a pair of driving MOSFETs which are turned on selectively according to the timing signal $\phi pa$. Corresponding column selection signals are supplied from a column address decoder CAD to each pair of switch MOSFETs of the sense amplifier SA respectively. Complementary internal address signals ay0–ayi of (i+1) bits are supplied from the column address buffer CAB to the column address decoder CAD, and the timing signal $\phi y$ is supplied from the timing generator TG thereto. Also Y address signals AY0–AYi are supplied in the time sharing manner through the address input terminals A0–Ai to the column address buffer CAB, and the timing signal ac is supplied from the timing generator TG thereto.

Corresponding timing signals $\phi sl$ or $\phi sr$ are made high levels thereby the shared MOSFETs of the sense amplifier SA are turned on selectively and all together. Thereby, the complementary bit lines of the memory array MARYL or MARYR are connected selectively to the complementary input/output node of the corresponding unit amplifier circuits of the sense amplifier SA.

The timing signal $\phi pa$ is made a high level and the internal supply voltage VCL and the earth potential are supplied through the driving MOSFET, thereby the unit amplifier circuits of the sense amplifier SA are made operation condition selectively. In this operation condition, each unit amplifier circuit of the sense amplifier SA amplifies very small read out signals outputted through corresponding complementary bit lines from a plurality of memory cells coupled with selected word lines of the memory array MARYL or MARYR, and makes the amplified signals binary readout signals of high level or low level.

Further, each unit circuit of the sense amplifier SA contains plural pairs switch MOSFETs of N-channel type as mentioned above. One side of these switch MOSFETs is each coupled with complementary input/output nodes of corresponding unit amplifier circuits of the sense amplifier SA, and the other Side is commonly coupled with non-inverted or inverted signal lines of the complementary common data lines CD. Corresponding column selection signals are supplied from a column address decoder CAD as hereinafter described to commonly coupled gates of each pair of the switch MOSFETs. These column selection signals are all made low level usually, and when the dynamic type RAM is made selection condition, the column selection signals are alternatively made high level according to Y address signals AY0–AYi.

Corresponding column selection is alternatively made high level, thereby each pair of switch MOSFETs are turned on selectively, and connect the complementary input/output nodes of corresponding unit amplifier circuits and the complementary common data lines CD selectively.

The timing signal $\phi y$ is made high level, thereby the column address decoder CAD is made operating condition selectively. In this operating condition, the column address decoder CAD decodes complementary internal address signals ay0–ayi and makes corresponding column selection signals high level alternatively.

A column address buffer VAB incorporates and holds Y address signals AY0–AYi supplied in the time sharing manner through the address input terminals A0–Ai according to the timing signal $\phi ac$. Further, it produces complementary internal address signals ay0–ayi based on these Y address signals and supplies them to the column address decoder CAD.

The complementary common data line CD is coupled with a main amplifier MA. A complementary writein signal WD is supplied from a data input buffer DIB to the main amplifier MA, and its output signal, that is, a complementary readout signal RD is supplied to a data output buffer DOB. Input terminal of the data input buffer DIB is coupled with data input terminal D$_{in}$, and output terminal of the data output buffer DOB is coupled with data output terminal D$_{out}$. Timing signals $\phi$w and $\phi$r are supplied from the timing generator TG to the main amplifier MA, and a timing signal $\phi$oe is supplied to the data output buffer DOB.

When the dynamic type RAMs are placed in a selection condition in the write mode and the timing signal $\phi$w is made high level, the main amplifier MA forms given write signals based on a complementary write signal WD supplied from the data input buffer DIB, and writes the formed signals through complementary common data line CD into selected memory cells of the memory array MARYL or MARYR. Also when the dynamic type RAMs are made selection condition in the readout mode and the timing signal $\phi$r is made a high level, readout signals outputted through the complementary common data line CD from selected memory cells of the memory array MARYL or MARYR are further amplified and transferred as complementary readout signals RD to the data output buffer DOB.

When the dynamic type RAMs are placed in the selection condition in the write-in mode, the data input buffer DIB forms a complementary write-in signal WD based on the write-in data supplied through the data input terminal Din, and supplies it to the main amplifier MA.

When the dynamic type RAMs are made selection condition in the read-out mode and the timing signal $\phi$oe is a high level, the data output buffer DOB forms a given output signal based on a complementary read-out signal RD supplied from the main amplifier MA, and outputs it externally through the data output terminal D$_{out}$.

In the dynamic type RAM of the embodiment, N-channel MOSFET Q79 with its gate receiving internal control signal tvo is provided between internal supply voltage feeding point VCL and the data output terminal D$_{out}$. This internal control signal tvo is made high level selectively, when the dynamic type RAM is made a given test mode, since so-called WCBR cycle is carried out where a column address strobe signal CASB and a write enable signal WEB are made low level before a row address strobe signal RASB, and simultaneously given bits of address signals A0–Ai are made high level. This high level is formed by boosting the internal supply voltage VCL, and is made a high voltage at least higher by a threshold voltage of the MOSFET Q79 than the internal supply voltage VCL. When the internal control signal tvo is made high level, the MOSFET Q79 is turned on, and the internal supply voltage VCL is outputted through external terminal, that is, the data output terminal D$_{out}$. As a result, trimmings and assessments of the internal supply voltages VCL are carried out efficiently without increasing special external terminals, and the test processes and costs of the dynamic type RAMs can be reduced.

The timing generator TG forms the above-mentioned various timing signals together with the internal control signals, based on row address strobe signals RASB, column address strobe signals CASB and write enable signals WEB supplied as starting control signals from the outside, complementary internal address signals axi of the most significant bit supplied from the row address buffer RAB together with address signals A0–Ai, and supplies them to each circuit of the dynamic type RAMs.

The external supply voltage VCC is supplied through the voltage supply terminal VCC to the voltage converter VC, and the timing signal $\phi$vc is supplied from the timing generator TG thereto. Here, the external supply voltage VCC is made +5.0 V, and the timing signal $\phi$vc is made high level while the dynamic type RAM is made selection condition. The external supply voltage VCC is supplied as a high internal supply voltage VCC, for example, to the row address buffer RAB and the column address buffer CAB together with input/output circuits such as the data input buffer DIB and the data output buffer DOB.

The voltage converter VC as shown in the block diagram of FIG. 35, comprises a reference voltage generator VRG, a fuse circuit FC, a standard voltage generator VLG and an internal supply voltage generator IVG. The external supply voltage VCC is supplied to these circuits. Further, test control signals PFS0–PFS5 are supplied to the fuse circuit FC through six test pads, and those output signals, that is, internal signals FN0–FN7 together with FB0–FB7 are supplied to the standard voltage generator VLG. Additionally, the reference voltage VRN (the first reference voltage) and the reference voltage VRB (the second reference voltage) are supplied from the reference voltage generator VRG to the standard voltage generator VLG, and those output signal, that is, the standard voltage V$_L$ is supplied to the internal supply voltage generator IVG. Further, the timing signal vc is supplied to the internal supply voltage generator IVG, and those output signal, that is, the internal supply voltage VCL is supplied to each circuit the dynamic RAMs.

Figure 32:
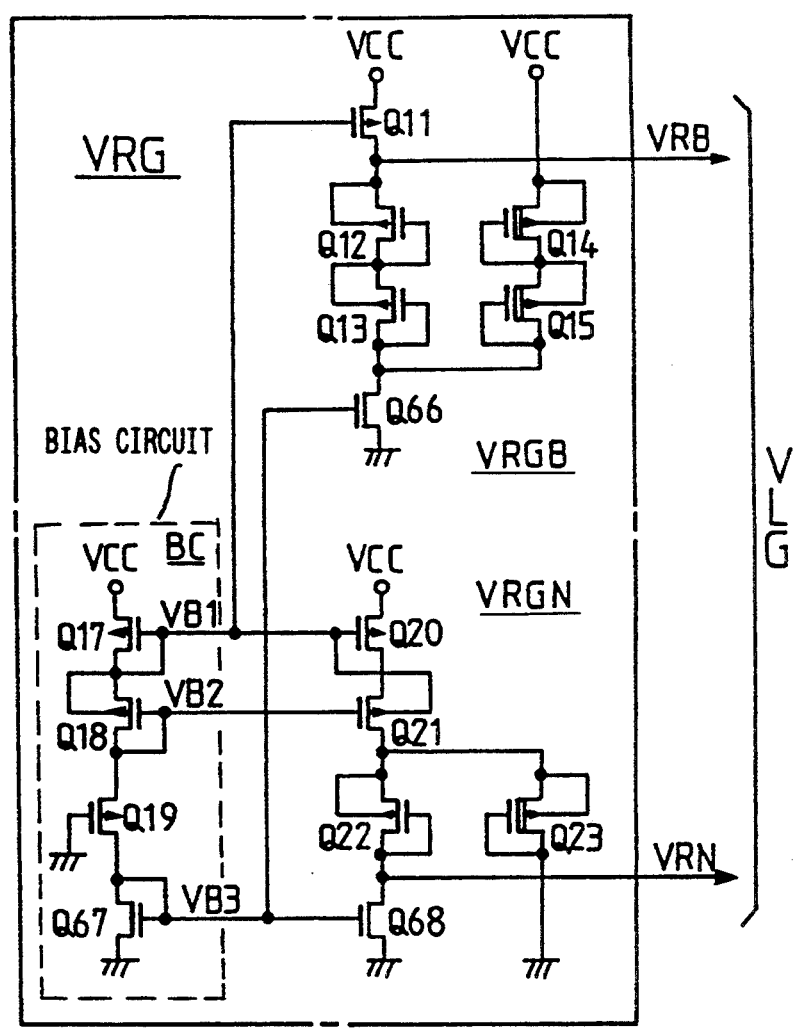
FIG. 32 is a circuit diagram showing an embodiment of a reference voltage generator contained in a voltage conversion circuit of dynamic type RAMs to which the present invention has been applied.

Here, the reference voltage generator VRG of the voltage converter VC is provided with a bias circuit BC and two reference voltage generators VRGN and VRGB, as shown in FIG. 32.

Among these circuits, the bias circuit BC is constituted by three P-channel MOSFETs Q17–Q19 and one N-channel MOSFET Q67, which are provided in series to each other between the external supply voltage Vcc and the earth potential of the circuit. The MOSFETs Q17 and Q18 together with Q67 are made diode-form by their gates and drains being commonly coupled-, and the MOSFET Q19 is made always ON-condition by its gate being coupled with the earth potential of the circuit. Therefore, as gate voltages of the MOSFETs Q17 and Q18 together with Q67, given bias voltages VB1–VB3 being set by source.drain voltages of the MOSFETs, that is, the threshold voltage can be obtained.

On the other hand, the reference voltage generator VRGN is not subject to a special limitation, but contains three P-channel MOSFETs Q20–Q22 and one N-channel MOSFET Q68, which are provided in series to each other between the external supply voltage Vcc and the earth potential of the circuit, and further contains one P-channel MOSFET Q23 which is provided in parallel to the MOSFETs Q22 and Q68. Here, the MOSFET Q23 is a MOSFET of high threshold voltage type whose threshold voltage is nearly two times of the threshold voltage V$_{THP}$ of normal P-channel MOSFETs such as MOSFET Q22, that is, 2 V$_{THP}$.

The bias voltage VB1 is supplied from the bias circuit BC to gate of the MOSFET Q20, and bias voltages VB2 and VB3 are supplied to gates of the MOSFETs Q21 and Q68 respectively. The MOSFETs Q22 and Q23 are made diode form by their gates and drains being commonly coupled, and potential of the commonly coupled drain of the MOSFETs Q22 and Q68 is supplied as the output signal of the reference voltage generator VRGN, that is, the reference voltage VRN to the standard voltage generator VLG in the succeeding stages.

In the reference voltage generator VRGN, current obtained through the MOSFETs Q20 and Q21 is diverted equally to the MOSFETs Q22 and Q23 by current limitation operation of the MOSFET Q68. Therefore, source.drain voltage of the MOSFET Q22 becomes nearly equal to its threshold voltage $V_{THP}$, and source.drain voltage of the MOSFET Q23 becomes nearly equal to its threshold voltage $2V_{THP}$. Thereby, the drain voltage of the MOSFET Q22, that is, the reference voltage VRN becomes nearly equal to $+V_{THP}$. In this embodiment, the threshold voltage $V_{THP}$ of the P-channel MOSFETs including the MOSFET Q22 is not specially limited, but approximately 0.9 V. The reference voltage VRN is approximately $+0.9$ V. But, actually, since the threshold voltage $V_{THP}$ is varied depending on the manufacturing process or the like, the reference voltage VRN becomes $+V_{THP} \pm \Delta V_{THP}$ containing its variation part $\Delta V_{THP}$, that is, about $+0.9 \pm \Delta V_{THP}$.

Similarly, the reference voltage generator VRGB contains three P-channel MOSFETs Q11–Q13 and one N-channel MOSFET Q66, which are provided in series to each other between the external supply voltage Vcc and the earth potential, and further contains two P-channel MOSFETs Q13 and Q14, which are provided in parallel to the MOSFETs Q11–Q13. Here, the MOSFETs Q14 and Q15 are of high threshold voltage type, whose threshold voltages are made approximately two times of the threshold voltage $V_{THP}$ of ordinary P-channel MOSFETs such as the MOSFETs Q11–Q13, as in the case of the above-mentioned MOSFET Q23, that is, $2V_{THP}$. The bias voltage VB1 is supplied to the gate of the MOSFET Q11, and the bias voltage VB3 is supplied to the gate of the MOSFET Q66. The MOSFETs Q12 and Q13 together with Q14 and Q15 are made diode form by their gates and drains being commonly coupled. The drain voltage of the MOSFET Q11, that is, the source voltage of the MOSFET Q12 is supplied to the standard voltage generator VLG as an output signal of the reference voltage generator VRGB, that is, as the reference voltage VRB.

In the reference voltage generator VRGB, current derived through the MOSFET Q66 is equally diverted to the MOSFETs Q12 and Q13 together with the MOSFETs Q14 and Q15 by current limiting process of the MOSFET Q11. Therefore the source.drain voltages of the MOSFETs Q12 and Q13 become approximately their threshold voltage $V_{THP}$ respectively, and the source.drain voltages of the MOSFETs Q14 and Q15 become approximately their threshold voltage $2V_{THP}$ respectively. Thereby the drain voltage of the MOSFET Q11, that is, the reference voltage VRB becomes approximately $VCC - 2V_{THP}$. In this embodiment, the threshold voltage $V_{THP}$ of the P-channel MOSFET is made about 0.9 V as mentioned above, and the reference voltage VRN becomes about $VCC - 1.8$ V. But, as the threshold voltage $V_{THP}$ varies actually by the manufacturing process, the reference voltage VRB contains the variation $\Delta V_{THP}$ and becomes $VCC - 2(V_{THP} \pm \Delta V_{THP})$, that is, approximately $VCC - 1.8 \pm 2\Delta V_{THP}$.

Figure 33:
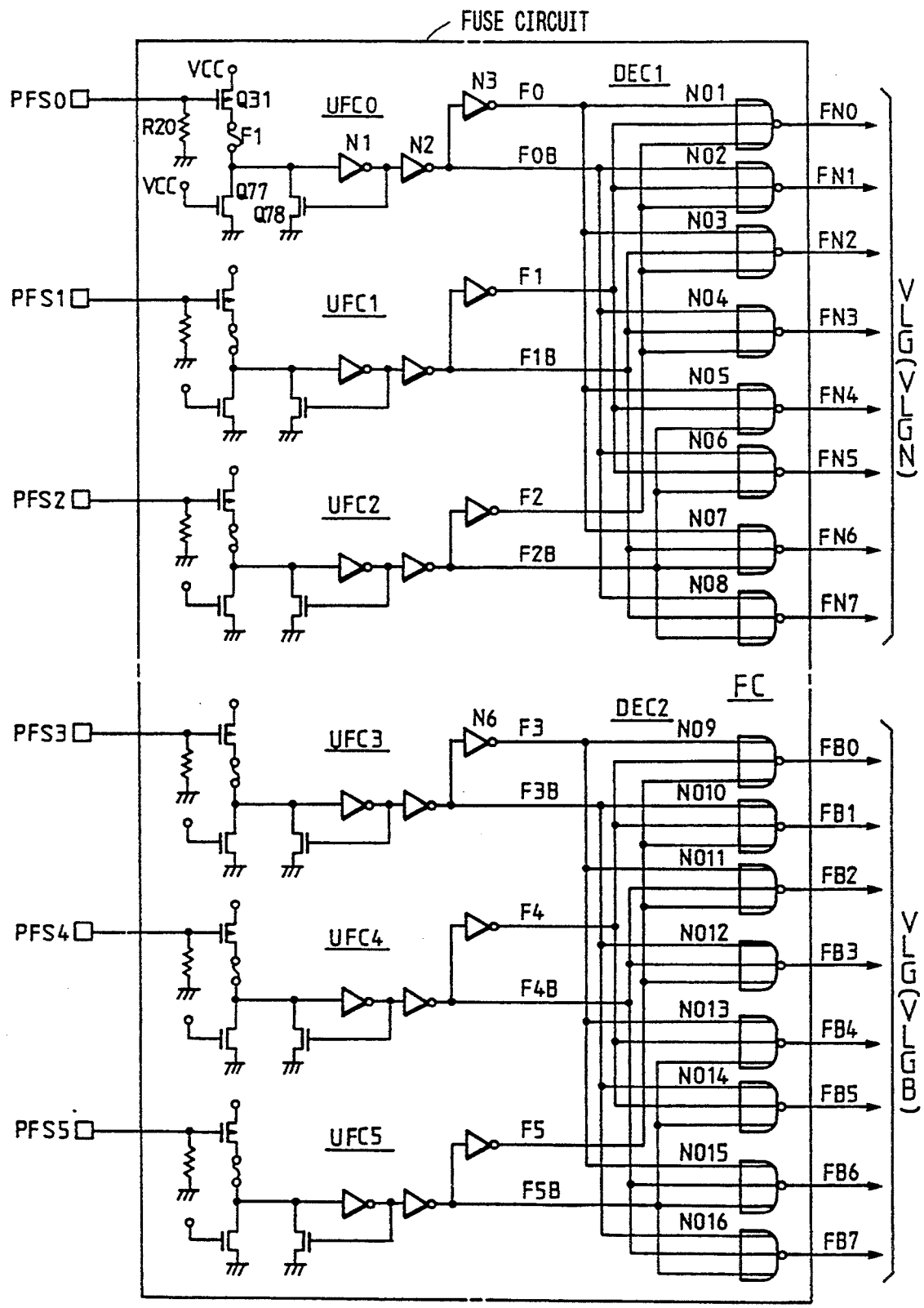
FIG. 33 is a circuit diagram showing an embodiment of a fuse circuit contained in a voltage conversion circuit of dynamic type RAMs to which the present invention has been applied.

Next, the fuse circuit FC is provided with six unit fuse circuits UFC0–UFC5 furnished corresponding to test control signals PFS0–PFS5, and two decoders DEC1 and DEC2, as shown in FIG. 33.

The unit fuse circuits UFC0–UFC5 of the fuse circuit FC contain fusing means F1 which is selectively interrupted by, for example, a laser beam etc., as shown by the unit fuse circuit UFC0 as representative. One side of these fusing means F1 is coupled with the external supply voltage VCC through P-channel MOSFET Q31 (artificial disconnection means). Also the other side is coupled with the earth potential of the circuit through N-channel MOSFETs Q77 and Q78, and further coupled with an input terminal of an inverter circuit N1. The gate of the MOSFET Q31 is coupled with the earth (or ground) potential of the circuit through a corresponding resistor R20, and further coupled with the test pads PFS0–PFSA5 respectively. The external supply voltage VCC is supplied to the gate of the the MOSFET Q77, and the output of the corresponding inverter circuit N1 is supplied to the gate of the MOSFET Q78 respectively. Thereby the MOSFET Q77 operates as a loading MOSFET, and the MOSFET Q78 operates as a feedback MOSFET transmitting the output signals of the inverter circuit N1 to its input terminal. The test pads PFS0–PFS5 are usually made open conditions, and coupled with the external supply voltage VCC selectively at the time of given test operations.

Output signals of the inverter circuit N1 are inverted the inverter circuit N2, and then made inverted output signals F0B–F5B of respective unit fuse circuits. These inverted output signals are further inverted by the inverter circuit N3, and then made non-inverted output signals F0–F5 of respective unit fuse circuits. Complementary output signals F0–E2 of the unit fuse circuits UFC0–UFC2 are supplied to the decoder DEC1, and complementary output signals F3–F5 of the unit fuse circuits UFC3–UFC5 are supplied to the decoder DEC2.

When the dynamic type RAMs are in normal operation conditions and the test pads are in open conditions, the MOSFET Q31 of the unit fuse circuits UFC-0–UFC5 is turned on by the ground potential being supplied through the corresponding resistor 20. At this time, if the corresponding fusing means F1 is not disconnected, since the input of the inverter circuit N1 becomes high level, the inverted output signals F0B–F5B of the unit fuse circuits UFC0–UFC5 become high level and the non-inverted output signals F0–F5 become ;oe level. Further at this time, if the corresponding fusing means F1 is disconnected, since the input of the inverter circuit N1 becomes low level, the inverted output signals F0B–F5B of the unit fuse circuits UFC-0–UFC5 become low level and the non-inverted output signals F0–F5 become high level.

On the other hand, when the dynamic type RAMs are in the given operation conditions and the the corresponding test pads. PFS0–PFS5 are coupled with the external supply voltage VCC, the MOSFET Q31 of the unit fuse circuits UFC0–UFC5 is turned off. Therefore the input of the inverter circuit N1 compulsorily becomes low level irrespective of the fusing means F1. For this reason, the inverted output signals F0B–F5B of the unit fuse circuits YFC0–UFC5 compulsorily become low level irrespective of the corresponding fusing means F1, and the non-inverted output signals F0–F5 become high level. That is, in the fuse circuit FC of this embodiment, the test pads PFS0–PFS5 are coupled with the external supply voltage VCC, thereby the cutting condition of the fusing means F1 of the corresponding unit fuse circuits UFC0–UFC5 can be made artificially.

The decoder DEC1 of the fuse circuit FC contains eight NOR gate circuits NO1–NO8. The inverted output signals F0B–F2B together with the non-inverted output signals F0–F2 of the unit fuse circuits UFC-0–UFC2 are supplied to the first through third input terminals of these NOR gate circuits in given combinations. The output signals of the NOR gate circuits NO1–NO8 are supplied as the output signals of the fuse circuit FC, that is, the internal signals FN0–FN7 to the standard voltage generator VLGN for the normal range of the standard voltage generator VLG. Thereby when the fusing means F1 of the unit fuse circuits UFC-0–UFC2 is placed in the disconnection condition or artificial disconnection condition in given combinations, the internal signals FN0–FN7 are made high level alternatively. That is, for example, when any fusing means F1 of the unit fuse circuits UFC0–UFC2 is not in disconnection condition or artificial disconnection condition, the internal signal FN0 is made high level alternatively, and when these fusing means are all in disconnection condition or in artificial disconnection condition, the internal signal FN7 is made high level alternatively.

Similarly, the decoder DEC2 of the fuse circuit FC contains eight NOR gate circuits NO9–NO16. The inverted output signals F3B–F5B together with the non-inverted output signals F3–F5 of the unit fuse circuits UFC3–UFC5 are supplied to the first through third input terminals of these NOR gate circuits in given combinations. The output signals of the NOR gate circuits NO9≠NO16 are supplied as the internal signals FB0–FB7 to the standard voltage generator VLGB for the burn-in range of the standard voltage generator VLG. Thereby when the fusing means F1 of the unit fuse circuits UFC3–UFC5 is made disconnection condition or artificial disconnection condition in corresponding combinations, the internal signals FB0–FB7 are made high level alternatively.

The standard voltage generator VLG is provided with a standard voltage generator for normal range VLGN (first standard voltage generator), a standard voltage generator for burn-in range VLGB (second standard voltage generator), and a standard voltage switching circuit VLS.

Among them, the standard voltage generator for normal range VLGN contains an operational amplifier circuit OA1 with a pair of differential MOSFETs Q55 and Q56 as main constitution. Drains of these MOSFETs are coupled with the external supply voltage VCC through a pair of P-channel MOSFETs Q7 and Q8, and their commonly coupled sources coupled with the earth potential of the circuit through N-channel MOSFET Q57. The MOSFETs Q7 and Q8 are made current-mirror condition thereby act as active loads for the differential MOSFETs Q55 and Q56, and the MOSFET Q57 having its gate supplied with given constant voltage VS1 acts as a constant-current source. Gates of the MOSFETs Q55 and Q56 are made the inverted input terminal−(first input terminal) and the non-inverted input terminal+(second input terminal) of the operational amplifier circuit OA1 respectively, and commonly coupled drains of the MOSFETs Q7 and Q8 are made output terminals of the operational amplifier circuit OA1.

The reference voltage VRN is supplied from the reference voltage generator VRG to the inverted input terminal−of the operational amplifier circuit OA1, that is, the gate of the MOS-FET Q55, and its output signal, that is, the commonly coupled drain voltage of the MOSFETs Q7 and Q55 is supplied to the gate of the P-channel control MOSFET Q9. Source of the control MOSFET Q9 is coupled with the external supply voltage VCC, and its drain is coupled with the output terminal VLN of the standard voltage generator VLGN through the P-channel MOSFET Q10 whose gate is subjected to the internal control signal TVLK. Resistors R10–R18 constituting a feedback circuit are provided in a series form between the output terminal VLN and the earth potential of the circuit. Moreover, each commonly coupled node of these resistors is commonly coupled with the non-inverted input terminal+of the operational amplifier circuit OA1 through the the feedback MOSFETs Q58–Q65. Corresponding internal signals FN0–FN7 are supplied from the fuse circuit FC to the gates of the feedback MOSFETs Q58–Q65 respectively. The voltage of the output terminal VLN is made the output signal of the standard voltage generator for normal range VLGN, that is, the standard voltage VLN (the first standard voltage), and is supplied to the internal supply voltage generator IVG as the output signal of the standard voltage generator VLG, that is, the standard voltage VL. A smoothing capacitor C2 having relatively large capacitance is provided between the output terminal and the earth potential of the circuit.

As stated above, the fusing means F1 of the unit fuse circuits UFC0–UFC2 of the fuse circuit FC is made disconnection condition or artificial disconnection condition in given combinations, thereby the internal signals FN0–FN7 are made high level alternatively. At this time, corresponding feedback MOSFETs Q58–Q65 are turned on alternatively in the standard voltage generator for normal range VLGN. Accordingly as shown in equivalent circuit of FIG. 28(a), the standard voltage VLN is divided from a feedback MOSFET which is turned on by the feedback resistor RA composed of resistor on the side of the output terminal VLN and the feedback resistor RB composed of resistor on the side of the earth potential of the circuit, and the divided voltage is fed back as the internal voltage VX to the non-inverted input terminal+of the operational amplifier circuit OA1.

As well known, the output signal of the operational amplifier circuit OA1 is made higher when its non-inverted input signal+, that is, the internal voltage VX is higher than the inverted input signal−, that is, the reference voltage VRN, and it is made low level in the condition opposite to the above. When the output signal of the operational amplifier circuit OA1 is made higher, conductance of the control MOSFET Q9 is made smaller thereby the standard voltage VLN, that is, the internal voltage VX is made lower. On the other hand, when the output signal of the operational amplifier circuit OA1 is made lower, the conductance of the control MOSFET Q9 is made larger thereby the standard voltage VLN, that is, the internal voltage VX is made higher. As a result, the operational amplifier circuit OA1 acts so that its non-inverted input signal+, that is, the internal voltage VX corresponds with the inverted input signal—, that is, the reference voltage VRN.

When the non-inverted input signal+, that is, the internal voltage VX of the operational amplifier circuit OA1 corresponds with its inverted input signal—, that is, the reference voltage VRN, the internal voltage VX becomes as follows.

$$VX = VRN$$
$$= VLN \times RB/(RA + RB)$$

Accordingly, the standard voltage VLN produced by the standard voltage generator for normal range VLG becomes $$VLN = VRN \times (RA + RB)/RB$$
$$= VRN \times \alpha$$

Needless to say, α is indicated as $$\alpha = (RA + RB)/RB$$

and corresponds to the feedback rate for the operational amplifier circuit OA1. In this embodiment, the above-mentioned feedback rate α is designed to have the center value about 3.67 without any special restriction. As mentioned above, since the reference voltage VRN is made about +0.9 V, the output signal of the standard voltage generator for normal range VLGN, that is, the center value of the standard voltage VLN becomes about +3.3 V.

Here, the value of the reference voltage VRN contains variable portion $\Delta V_{THP}$ of threshold voltage of the MOSFET due to the manufacturing process as mentioned above, and with this, the value of the standard voltage VLN varies the fusing means F1 of the unit fuse circuits UFC0–UFC2 of the fuse circuit FC is made disconnected condition selectively in the given combination and the corresponding feedback MOSFETs Q58–Q65 are turned on alternatively, thereby the wanted value, that is, +3.3 V can be set, trimming the value of the standard voltage VLN. Further, in this trimming process, the fusing means F1 of the unit fuse circuits UFC0–UFC2 of the fuse circuit FC can be made artificially disconnected condition by supplying the external supply voltage VCC to the corresponding test pads PFS0–PFS2 as stated above. As a result, the combination of the fusing means F1 to be disconnected can be found out without disconnecting the fusing means F1 physically, and the trimming of the standard voltage VLN can be carried out efficiently and what is more accurately.

By the way, the MOSFET Q10 whose gate receives the internal control signal TVLK is provided between the control MOSFET Q9 and the output terminal VLN in the normal range standard voltage generator VLNG. This internal control signal TVLK is made low level normally, and when the test operation for the estimation of operation margin of the dynamic type RAMs, the control signal TVLK is selectively made high levels such as the external supply voltage VCC. When the dynamic type RAMs are made the normal operation mode and the internal control signal TVLK is made low level, in the normal range standard voltage generator VLGN, the MOSFET Q10 is turned on and the control operation of the standard voltage VLN is carried out. But, when the test operation for estimating the operation margin of the dynamic type RAMs is carried out and the internal control signal TVLK is made high level, the MOSFET Q10 is turned off and the normal range standard voltage generator VLGN substantially stops its operation.

Next, the burn-in range standard voltage generator VLGB of the standard voltage generator VLG contains an operational amplifier circuit OA2 with P-channel differential MOSFETs Q5 and Q6 as main constitution, and N-channel control MOSFET Q49 receiving the output signal of the operational amplifier circuit OA2. The drain of the control MOSFET Q49 is coupled with the external supply voltage VCC through series resistors R1–R9 constituting the feedback circuit together with N-channel MOSFETs Q41–Q48. Corresponding internal signals FB0–FB7 are supplied from the fuse circuit FC to gates of the feedback MOSFETs Q41–Q48 respectively, and their commonly coupled sources are coupled with the non-inverted input terminal— of the operational amplifier circuit OA2, that is, the gate of the MOSFET Q6. The reference voltage VRB is supplied from the reference voltage generator VRG to the inverted input terminal— of the operational amplifier circuit OA2, that is, the gate of the MOSFET Q5. Drain potential of the control MOSFET Q49 is made the output signal of the standard voltage generator for burn-in range VLGB, that is, the standard voltage VRB.

As stated above, the fusing means F1 of the unit fuse circuits UFC3–UFC5 of the fuse circuit FC is made disconnected condition or artificially disconnected condition in the corresponding combinations, thereby the internal signals FB0–FB7 are made high level alternatively. At this time) in the burn-in range standard voltage generator VLGB, the corresponding feedback MOSFETs Q41–Q48 are turned on alternatively. For this reason, the standard voltage VLB is divided by the feedback resistor RC composed of resistors on the external supply voltage VCC side and the feedback resistor RD composed of resistors on the output terminal VLB side, and is fed back from the MOSFET being turned on to the to the non-inverted input terminal of the operational amplifier circuit OA2 as the internal potential VY, as shown in an equivalent circuit diagram of FIG. 28(b).

As well known, the output signal of the operational amplifier circuit OA2 is made higher when its non-inverted input signal +, that is, the internal voltage VY is made higher than the inverted input signal—, that is, the reference voltage VRB, and it is made lower in the contrary condition. When the output signal of the operational amplifier circuit OA2 is made higher, conductance of the control MOSFET Q49 is made larger, thereby the standard voltage VLB, that is, the internal voltage VY is made lower. On the other hand, when the output signal of the operational amplifier circuit OA2 is made lower, conductance of the control MOSFET Q49 is made smaller, thereby the standard voltage VLB, that is, the internal voltage VY is made higher. As a result, the operational amplifier circuit OA2 acts so that its non-inverted output signal +, that is, the internal voltage VY corresponds with the inverted input signal—, that is, the reference voltage VRB.

When the non-inverted input signal+of the operational amplifier circuit OA2, that is, the internal voltage VY corresponds with its inverted input signal—, that is, the reference voltage VRB, the internal voltage VY becomes $$VY = VRB$$
$$= VLB + (VCC - VLB) \times RD/(RC + RD)$$

But, the reference voltage VRB being $$VRB = VCC - 2\,V_{THP}$$

as mentioned above, and the above equation being arranged, the equation becomes $$VLB[1 - RD/(RC+RD)] = VCC[1 - RD/(RC+RD)] - 2\,V_{THP}$$

Thereby $$VLB = VCC - 2\,V_{THP}/[1 - RD/(RC + RD)]$$
$$= VCC - 2\,V_{THP} \times (RC + RD)/RC$$
$$= VCC - 2\,V_{THP} \times \beta$$

Needless to say, $\beta$ becomes $$\beta = (RC+RD)/RC$$

and it corresponds to the feedback rate for the operational amplifier circuit OA2. In this embodiment, the feedback rate is designed so that its center value becomes about 1.5, with no special limitation. As mentioned above, since the threshold voltage $V_{THP}$ of the P-channel MOSFET is about 0.9 V, the output signal of the burn-in range standard voltage generator VLCB, that is, the center value of the standard voltage VLN becomes VCC−2.7 V, and can be enlarged in proportion to the value of the external supply voltage VCC.

Here, the value of the above-mentioned reference voltage VRB contains variable portions $\Delta V_{THP}$ of the threshold voltage of the MOSFET due to the manufacturing process, and becomes $$VRB = VCC - 2(V_{THP} \pm \Delta V_{THP})$$

Therefore, the value of the above-mentioned standard voltage VLB varies with this variable portions $\Delta V_{THP}$. In this case, the fusing means F1 of the unit fuse circuits UFC3-UFC5 of the fuse circuit FC is made disconnected condition or artificially disconnected condition in a given combination selectively, and the corresponding MOSFETs Q41-Q48 are turned on alternatively, thereby the trimming of the values of the standard voltage VLB and setting of the given value, that is, VCC−2.7 V can be carried out.

The standard voltage switching circuit VLS of the standard voltage generator VLG contains a pair of N-channel MOSFETs Q50 and Q51 in differential type, without special limitations. Drains of these differential MOSFETs are coupled with the external supply voltage VCC through a pair of P-channel MOSFETs Q1 and Q2 which form active loads, and a constant-current source being composed of N-channel MOSFET Q52 is installed between the commonly coupled source and the earth potential of the circuit. The gate of the MOSFET Q50 is supplied with the output signal of the burn-in range standard voltage generator VLGB, that is, the standard voltage VLB, and the gate of the other MOSFET Q51 is supplied with the output signal of the normal range standard voltage generator VLGN, that is, the standard voltage VLN. P-channel control MOSFET is installed between the external supply voltage VCC and the gate of the MOSFET Q51, that is, the output terminal VL. The drain potential of the MOSFET Q50 is supplied to the gate of the control MOSFET Q3. Hereby, a differential circuit fundamentally composed of the MOSFETs Q50 and Q51 acts as a comparator comparing levels of the standard voltages VLB and VLN, and the control MOSFET Q3 acts selectively as that for the standard voltage VL, provided the output signal of the comparator is made low level, in other words, provided the level of the standard voltage VLB is higher than that of the standard voltage VLN.

That is, when the standard voltage VLB is lower than the standard voltage VLN, the output signal of the comparator composed of the MOSFETs Q50 and Q51 becomes high level such as the external supply voltage VCC. Thereby, the MOSFET Q3 is turned off, and does not act as the control MOSFET. On the other hand, when the standard voltage VLB becomes higher than the standard voltage VLN, the output signal of the comparator becomes low level according to the standard voltage VLB. Thereby, the MOSFET Q3 is turned on, and acts as the control MOSFET for the standard voltage VL. As mentioned above, the value of the standard voltage VLB is made larger in proportion to the external supply voltage VCC. As a result, when the value of the external supply voltage VCC is made less than a given value, that is, when the the external supply voltage VCC is made the first domain, the standard voltage VL corresponds to the output signal of the normal range standard voltage generator VLGN, that is, the standard voltage VLN, and when the external voltage is made more than a given value, that is, when the external supply voltage VCC is made the second domain, the standard voltage VL is varied according to the output signal of the burn-in range standard voltage generator VLGB, that is, the standard voltage VLB.

The output signal of the standard voltage generator VLG, that is, the standard voltage VL is supplied to the internal supply voltage generator IVG as mentioned above.

Figure 34:
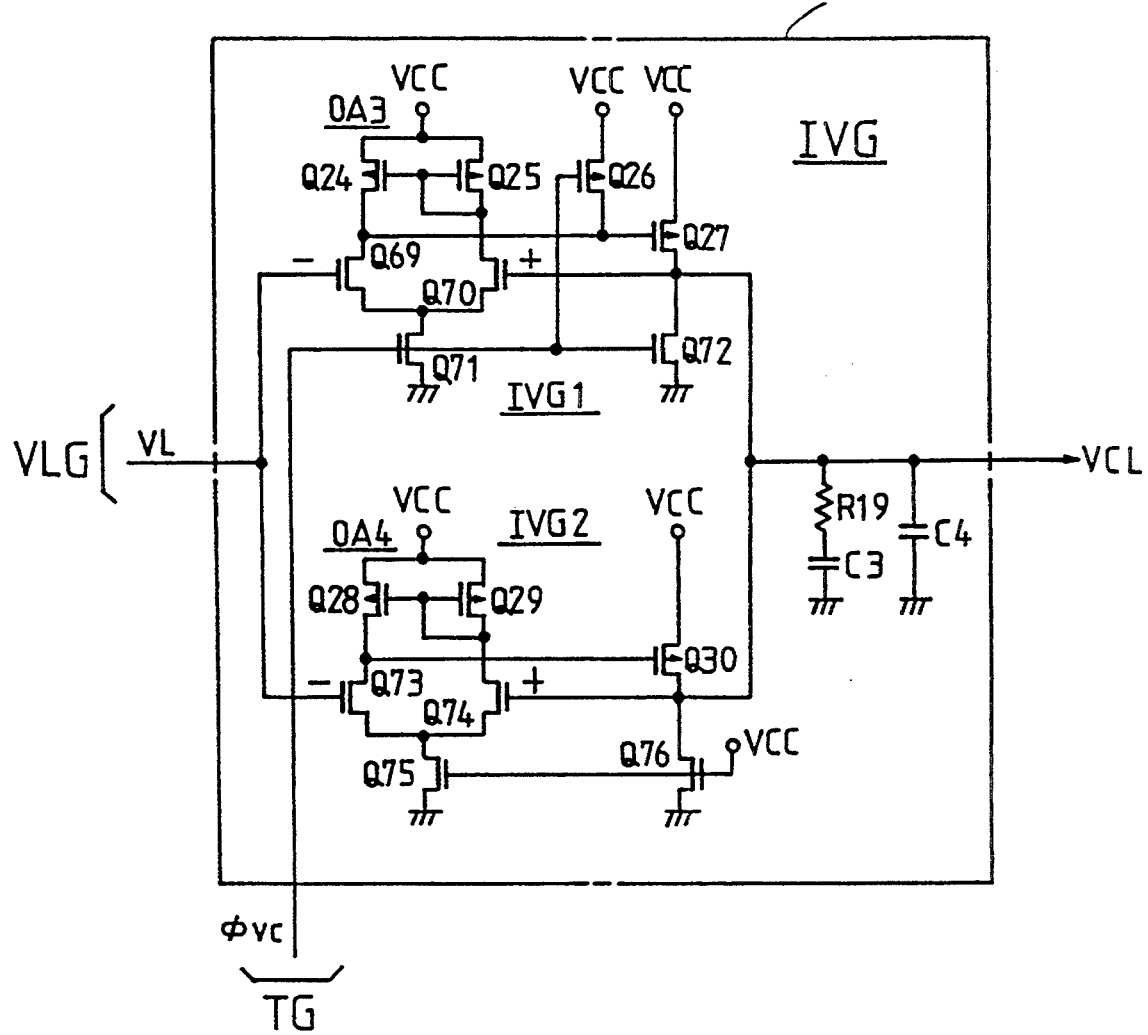
FIG. 34 is a circuit diagram showing an embodiment of an internal supply voltage generator contained in a voltage conversion circuit of dynamic type RAMs to which the present invention has been applied.

The internal supply voltage generator IVG comprises two internal supply voltage generators IVG1 and IVG2 as shown in FIG. 34. Smoothing capacitors C3 and C4 together with a resistor R19 are provided between the commonly coupled output terminal of these internal supply voltage generators and the earth potential of the circuit.

The internal supply voltage generator IVG contains an operational amplifier circuit OA3 having a fundamental constitution by N-channel differential MOSFETs Q69 and Q70. The drains of the differential MOSFETs Q69 and Q70 are coupled with the external supply voltage VCC through P-channel MOSFETs Q24 and Q25 being made active loads, and the commonly coupled source of the MOSFETs Q69 and Q70 is coupled with the earth potential through N-channel MOSFET Q71. Timing signal $\phi vc$ is supplied from a timing generator TG to the gate of the MOSFET Q71. As mentioned above, the timing signal $\phi vc$ is made a high level selectively while the dynamic type RAMs are in selection condition. Thereby, when the dynamic type RAMs are made selection condition and the timing signal φvc is made a high level, the operational amplifier circuit OA3 is made operation condition selectively.

The inverted input terminal—of the operational amplifier circuit OA3, that is, the gate of the MOSFET Q69 is supplied with the standard voltage VL. Further, the output signal of the operational amplifier circuit OA3 is supplied to gate of P-channel control MOSFET q27 which is provided between the external supply voltage VCC and the non-inverted input terminal—of the operational amplifier circuit OA3, that is, the gate of the MOSFET Q70. Here, the control MOSFET Q27 is designed to have relatively large conductance. The drain of the control MOSFET Q27 is coupled with the earth potential of the circuit through N-channel MOSFET Q72 whose gate receiving the timing signal φvc, and is also coupled with the output terminal of the internal supply voltage generator IVG, that is, the internal supply voltage feeding point VCL. Additionally, between the external supply voltage VCC and the gate of the control MOSFET Q27 is installed P-channel MOSFET Q26 whose gate receives the timing signal φvc.

From these circumstances, when the dynamic type RAMs are made selection condition and the timing signal φvc is made high level, The internal supply voltage generator IVG1 is made selectively operating condition, and acts so that its output signal, that is, the level of the internal supply voltage VCL corresponds with the standard voltage VL. At this time, current feeding capability of the internal supply voltage generator IVG1 becomes relatively larger since the conductance of the control MOSFET Q27 is made larger. When the dynamic type RANs are made non-selection condition and the timing signal φvc is made low level, the operation of the internal supply voltage generator IVG1 is interrupted.

On the other hand, the internal supply voltage generator IVG2 contains an operational amplifier circuit OA4 which has N-channel differential MOSFETs Q73 and Q74 as the fundamental constitution. The drains of these differential MOSFETs Q73 and Q74 are coupled with the external supply voltage VCC through P-channel MOSFETs Q28 and Q29 which become active loads, and the commonly connected source of the MOSFETs Q73 and Q74 is coupled with the earth potential of the circuit through N-channel MOSFET Q74. The external supply voltage VCC is supplied to the gate of the MOSFET Q75, thereby the operational amplifier circuit OA is made operation condition always.

The inverted input terminal—of the operational amplifier circuit OA4, that is, the gate of the MOSFET Q73 is supplied with the standard voltage VL. Further, the output signal of the operational amplifier circuit OA4 is supplied to gate of P-channel control MOSFET Q30 which is provided between the external supply voltage VCC and the non-inverted input terminal+of the circuit OA4, that is, the gate of the MOSFET Q74. Here, the control MOSFET Q30 is designed to have relatively small conductance. The drain of the control MOSFET Q30 is coupled with the earth potential of the circuit through N-channel MOSFET Q76 whose gate receiving the external supply voltage VCC, and is also coupled with the internal supply voltage feeding point VCL.

From these circumstances, the internal supply voltage generator IVG2 is always made operation condition independent of the selection condition of the dynamic type RAMs, and acts so that its output signal, that is, the level of the internal supply voltage VCL corresponds with the standard voltage VL. At this time, the current feeding capability of the internal supply voltage generator IVG2 becomes relatively smaller since the conductance of the control MOSFET Q30 is made smaller. As a result, the current feeding capability of the internal supply voltage generator IVG as a whole is made larger when the dynamic type RAMs are made selection condition, and it is made smaller to the minimum as is necessary when the RAMs are made non-selection condition.

By the way, as mentioned above, the standard voltage VL supplied from the standard voltage generator VLG is stabilized to the standard voltage VLN, i.e., +3.3 V when the external supply voltage VCC is made less than a given value, and it is made higher in proportion to the external supply voltage VCC when the external supply voltage is made more than a given value. But, as shown in the output characteristic diagram of FIG. 29, when the external supply voltage VCC is made less than the given value, in other words, when the external supply voltage VCC is in the normal range VM (the first range), the center value of the internal supply voltage VCL is fixed to VCLN, i.e., +3.3 V, and when the external supply voltage VCC is made more than the given value, in other .words, the external supply voltage VCC is in the burn-in range BT (the second range), the center value of the internal supply voltage VCL becomes $$
\begin{aligned}
VCL &= VCC - VS \\
&= VCC - 2\,V_{THP} \times \beta \\
&= VCC - 2.7
\end{aligned}
$$

and is made higher in proportion to the external supply voltage VCC.

Further in the dynamic type RAMs of the embodiment, as above described, the fusing means F1 of the unit fuse circuits UFC3–UFC5 of the fuse circuit FC is selectively made disconnected condition or artificially disconnected condition, thereby the standard voltage VL in the burn-in range, that is, VLB is trimmed. For this reason, the value of the internal supply voltage VCL in the burn-in range BT is brought close to the center value, regardless of the variations of the threshold voltage $V_{THP}$ of the P-channel MOSFET to determine the reference voltage VRB according to the manufacturing process or the like, and is made to represent only relatively small variation EC as shown in solid line of FIG. 29. Moreover, in case there is no trimming means, relatively large variation EO is brought about as shown by dotted line in FIG. 29. By this means, the value of the internal supply voltage VCL at the burn-in test can be set to the value sufficiently close to the desired voltage VCLB. As a result, the error detection rate of the burn-in test, that is, the screening accuracy is raised and the reliability of the dynamic type RAMs is raised, and also the breakdown of the normal circuit elements due to so-called overkill is reduced and the yield of the dynamic type RAMs is improved.

As shown in the above embodiments, the present invention is applied to the semiconductor integrated circuit devices of the dynamic type RAMs containing voltage conversion circuit, thereby the working effects can be obtained as follows.

(1) A voltage converter contained in dynamit type RAMs and having so-called burn-in range where its output voltage, i.e., the internal supply voltage is made higher in proportion to the external supply voltage during burn-in test, is provided with fusing means which can selectively change the value of the internal supply voltage owing to being disconnected in a given combination, thereby the effect obtained is that the value of the internal supply voltage in the burn-in range is trimmed and the variation due to the manufacturing dispersion can be suppressed.

(2) According to the item (1), an effect is obtained in that the error detection rate of the burn-in test can be raised and accuracy of its screening can be raised.

(3) According to the item (1), an effect is obtained in that the breakdown of normal circuit elements due to so-called overkill is decreased and the yield of dynamic type RAMs can be raised.

(4) In the items (1)–(3), other fusing means is provided which can selectively chabge the value of the internal supply voltage in normal operation owing to being disconnected in a given combination, thereby effect is obtained in that the values of the internal supply voltage in so-called normal range are trimmed and the variation due to the manufacturing dispersion can be suppressed.

(5) According to the item (4), effect is obtained in that operation of the dynamic type RAMs can be stabilized in normal operation mode.

(6) In the items (1)–(5), artificial disconnection means of MOSFETs which is selectively turned off according to given test control signals is installed in series to the fusing means, thereby effect is obtained in that the fusing means for trimming can be artificially disconnected, and combination of fusing means to be disconnected is previously determined and checked thereby the trimming accuracy can be raised.

(7) According to the item (6), effect is obtained in that the internal supply voltage etc. can be trimmed without disconnecting the fusing means physically.

(8) In the items (1)–(7), when the test operation or the like to estimate the dynamic type RAMs is performed, effect is obtained in that the value of the internal supply voltage in normal range can be made higher in proportion to the external supply voltage, thereby the value of the internal supply voltage at the time of operation margin estimation can be set according to the external supply voltage.

(9) In the items (1)–(8), MOSFET to be turned on selectively at the time of the dynamic type RAMs being made a given test mode is provided between the internal supply voltage feeding point and the given external terminal, thereby effect is obtained in that the value of the internal voltage can be monitored through the external terminal after completion of the dynamic type RAMs.

(10) According to the items (6)–(9), effect is obtained in that the test operation of the dynamic type RAMs is made efficient and its test man-hours can be reduced.

(11) According to the items (1)–(10), effect is obtained in that the cost reduction of the dynamic type RAMs can be prompted by raising its reliability.

Figure 30:
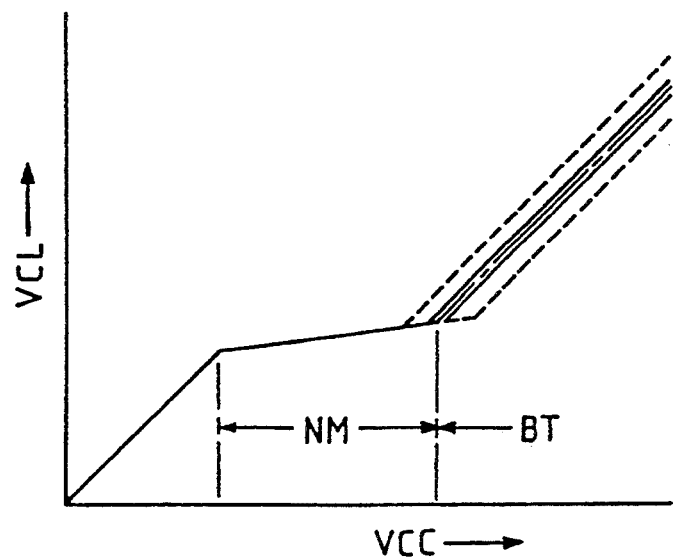
FIG. 30 is an output characteristics diagram showing an embodiment of a voltage conversion circuit including a standard voltage generator in FIG. 27.
Figure 31:
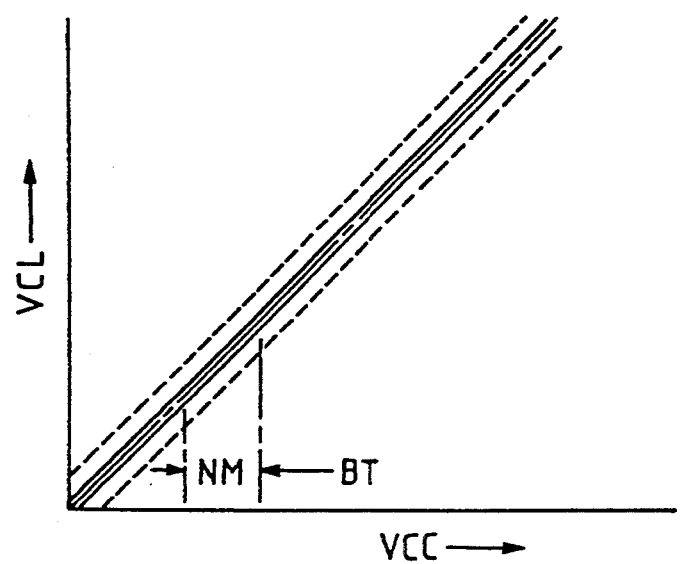
FIG. 31 is an output characteristics diagram showing an embodiment of a voltage conversion circuit including a standard voltage generator in FIG. 27.

The invention made by the present inventor has been described concretely based on the embodiments, and it is needless to say that the present invention is not limited to the embodiments but various changes and modifications may be made in the invention without departing from the spirit and scope thereof. For example, in FIG. 27, the number of MOSFETs and resistors constituting the feedback circuits of each standard voltage generator, that is to say, the number of trimming steps of the internal supply voltage VCL can be set arbitrarily. Further, concerning means for trimming the standard voltages VLN and VLB together with VL, various kind of methods can be considered, and the concrete values of these standard voltages together with the reference voltages VRN and VRB are arbitrary. In FIG. 29, the voltage converter VC may also have output characteristics as shown in FIG. 30 or FIG. 31. That is, in the case of FIG. 30, the internal supply voltage VCL in the normal range NM increases slowly in proportion to the external supply voltage VCL. Also in the case of FIG. 31, the internal supply voltage VCL is made higher in proportion to the external supply voltage VCC, with the same ratio as the burn-in range BT, in normal range NM, too. In both cases, the value of the internal supply voltage VCL in the burn-in range BT is trimmed by, for example, the fusing means being selectively disconnected, and the variation due to its manufacturing dispersion is suppressed. In FIG. 33, the number of the fusing means provided in the fuse circuit FC ia arbitrary, and the various embodiments regarding methods of identifying their disconnection condition or methods of decoding will be able to be considered. Further, when the number of trimming steps of the standard voltage is made much larger and the number of the fusing means is made much larger, the fuse circuits FC may adopt modifications as in FIG. 37. That is, in FIG. 37, the fuse circuit FC is provided with a fuse circuit FCN corresponding to the normal range and containing n unit fuse circuits, a fuse circuit FCB corresponding to the burn-in range and containing n unit fuse circuits, and counter circuits CTRN and CTRB of n bits corresponding to these fuse circuits FCN and FCB. To these counter circuits, reset signal and count up pulse CU are commonly supplied, and enable signals TEN and TEB are supplied respectively. Then, these counter circuits carry out stepping operations due to the count up pulse CU selectively by the corresponding enable signals TEN or TEB being made high levels, and the output signal, that is, the internal signal $CN0–CN_{n-1}$ or $CB0–CB_{n-1}$ is made effective. As a result, a number of test pads are not provided corresponding to each unit fuse circuit, but artificial disconnection condition fusing means the fuse circuit FCN or FCB can be realized in various combinations. In FIG. 34, the internal supply voltage generator IVG need not be provided with a plurality of internal supply voltage generators having different current feeding capabilities, and these need not be made operation condition selectively according to given timing signals. In FIG. 35, the external supply voltage VCC need not be supplied especially to circuits except the voltage converter VC, and concrete values of the external supply voltage VCC and the internal supply voltage VCL are arbitrary. Further, dynamic RAMs may be provided with, for example, a plurality of similar voltage converters having different output voltages. In FIG. 36, the dynamic RAMs may be provided with a plurality of memory mats, and may be of so-called multi-bits constitution which can input and output the multi-bits memory data simultaneously. Moreover, it is not a necessary condition for the dynamic type RAMs to adopt a shared sense system and an address multiplex system. External terminal monitoring the internal supply voltage may be a data input terminal Din or either of address input terminals Ao–Ai. Further, concrete circuit arrangements of the standard voltage generator VLG, the reference voltage generator VRG, the fuse circuit FC and the internal supply voltage generator IVG shown in FIG. 27 and FIGS. 32–34, and block constitutions of the voltage converter VC and the dynamic type RAMs, together with any combination of control signals or address signals and supply voltages, etc. as shown in FIGS. 35 and 36 may take various forms of embodiment.

The invention made by the present inventor has been described mainly in the case of application to the dynamic type RAMs in the industrial field forming the background of the present invention. However, the present invention is not limited to the above, but may be applied to, for example, various kinds of semiconductor memory devices containing voltage conversion circuits and logical integrated circuit devices for gate array integrated circuit or the like. Additionally, the invention which makes any fusing means disconnected conditions artificially can also be applied to various kinds of semiconductor memory devices and logical integrated circuit devices equipped with a fusing means for switching inferior elements to the redundant circuit selectively, or a fusing means for trimming other circuit constant. The present invention can be widely applied to at least semiconductor devices containing voltage conversion circuit or having a fusing means. Microcomuter system shown in FIG. 26 can also be constituted, using dynamic type RAMs to which the present invention is applied.

Effects obtained by the representative ones of the invention disclosed in the present patent application will be briefly explained as follows. A voltage conversion circuit contained in dynamic type RAMs and having so-called burn-in range in which the output voltage at the time of the acceleration test operation, that is, the internal supply voltage is changed in proportion to the external supply voltage, is provided with a fusing means which can switch selectively the value of the intetnal supply voltage in the burn-in range by being disconnected in given combinations. Also, an artificial disconnecting means is provided which can make these fusing meand disconnected conditions artificially, and further the value of the internal supply voltage can be monitored through a given external terminal. Thereby, the screening accuracy of the burn-in test can be raised by trimming efficiently the value of the internal supply voltage in the burnin range, and by suppressing the variation due to the manufacturing dispersion or the like. Moreover, damages of normal circuit elements caused by so-called overkilling can be reduced, and the yield of the dynamic RAMs can be raised. This results in raising the reliability of the dynamic type RAMs and promiting the cost reduction.

What is claimed is:

1. A semiconductor integrated circuit device comprising:

a voltage conversion circuit which converts an external supply voltage to a reduced potential value and which generates an internal supply voltage necessary for effecting normal operation of said device, said internal supply voltage having a first potential value when said external supply voltage is within a first range and having a second potential value when said external supply voltage is within a second range, wherein said voltage conversion circuit comprises means for trimming the potential value of said internal supply voltage when said external supply voltage is determined to be within said second range, and wherein said device operates in said normal operation when said external supply voltage is within said first range.

2. A semiconductor integrated circuit device according to claim 1, wherein the potential value of said internal supply voltage is substantially fixed at a given potential when the potential value of said external supply voltage is within said first range, and wherein said internal supply voltage is changed in proportion to the potential value of said external supply voltage when said external supply voltage is determined to be within said second range.

3. A semiconductor integrated circuit device according to claim 2, wherein said voltage conversion circuit further comprises means for trimming the potential value of said internal supply voltage when the external supply voltage is within said first range.

4. A semiconductor integrated circuit device according to claim 3, wherein said voltage conversion circuit comprises:

a first standard potential generator for forming a first standard potential on receiving a first reference potential;

a second standard potential generator for forming a second standard potential on receiving a second reference potential;

a standard potential switching circuit for transmitting said first standard potential when said external supply voltage is within said first range, and for transmitting said second standard potential when said external supply voltage is within said second range; and an internal supply voltage generator for forming said internal supply voltage on receiving said first or second standard potential transmitted through said standard potential switching circuit, wherein said first potential value of said internal supply voltage corresponds to said first standard potential and said second potential value of said internal supply voltage corresponds to said second standard potential.

5. A semiconductor integrated circuit device according to claim 4, wherein each of said first and second standard potential generators comprises:

an operational amplifier circuit for receiving said first or second reference potential at a first input terminal thereof;

a control MOSFET coupled to receive at a gate thereof an output signal of said operational amplifier circuit; and a feedback circuit for transmitting the corresponding one of said first or second standard potential to a second input terminal of said operational amplifier circuit at a given feedback rate, wherein the potential value of said internal supply voltage is trimmed by switching the feedback rate selectively.

6. A semiconductor integrated circuit device according to claim 5, wherein the trimming of the potential value of said internal supply voltage is effected through control of respective fusing means, and wherein the feedback rate is switched selectively by controlling connection/disconnection of said fusing means in accordance with available combinations.

7. A semiconductor integrated circuit device according to claim 2, wherein said voltage conversion circuit comprises artificial disconnecting means for bringing about artificially the disconnection condition of said fusing means.

8. A semiconductor integrated circuit device according to claim 7, wherein said artificial disconnecting means comprises a MOSFET which is arranged in series with said fusing means and which is turned off selectively according to a given test control signal.

9. A semiconductor integrated circuit device according to claim 8, wherein the potential value of said internal supply voltage at the time in which said external supply voltage is within said first range is changed selectively in proportion to the potential value of said external supply voltage at the time of a test operation.

10. A semiconductor integrated circuit device according to claim 9, wherein said test operation is carried out to determine an operation margin of said semiconductor integrated circuit device.

11. A semiconductor integrated circuit device according to claim 1, further comprising means for supplying the potential value of said internal supply voltage to a given external terminal of said device.

12. A semiconductor integrated circuit device according to claim 11, wherein said external terminal is employed for other given purposes when said semiconductor integrated circuit device is at a normal operation mode.

13. A semiconductor integrated circuit device according to claim 12, wherein said semiconductor integrated circuit device is a dynamic type RAM.

14. A semiconductor integrated circuit device formed on a semiconductor substrate comprising:
(a) a voltage conversion circuit comprising:
(1) a first voltage generator supplied with a first supply voltage and a second supply voltage lower in magnitude than said first supply voltage, said first voltage generator producing a first output voltage on the basis of said second supply voltage;
(2) a second voltage generator supplied with said first supply voltage and said second supply voltage, said second voltage generator producing a second output voltage on the basis of said first supply voltage; and
(3) a selection circuit for receiving said first output voltage and said second output voltage, and outputting an internal supply voltage based on one of said first output voltage and said second output voltage, and
(b) an internal circuit for receiving said internal supply voltage.

15. A semiconductor integrated circuit device according to claim 14,
wherein said first output voltage is higher in magnitude than said second supply voltage by a predetermined first voltage level, and
wherein said second output voltage is lower in magnitude than said first supply voltage by a predetermined second voltage level.

16. A semiconductor-integrated circuit device according to claim 15,
wherein said selection circuit selects that one of said first output voltage and said second output voltage having the greater magnitude, and outputs the same as said internal supply voltage.

17. A semiconductor integrated circuit device according to claim 14,
wherein said first output voltage is higher in magnitude than said second supply voltage by a predetermined first voltage level, when said first supply voltage is within a first range, and
wherein said second output voltage is lower in magnitude than said first supply voltage by a predetermined second voltage level, when said first supply voltage is within a second range.

18. A semiconductor integrated circuit device according to claim 17,
wherein said first range and said second range are consecutively occurring ranges.

19. A semiconductor integrated circuit device according to claim 18,
wherein said first output voltage is substantially the same as said first supply voltage, when said first supply voltage is within a third range, and
wherein said first range and said third range are consecutively occurring ranges.

20. A semiconductor integrated circuit device according to claim 19,
wherein said third range of said first supply voltage is associated with voltages between a first level and a second level, higher than said first level,
wherein said first range of said first supply voltage is associated with voltages between said second level and a third level, higher than said second level, and
wherein said second range of said first supply voltage is associated with voltages between said third level and a fourth level, higher than said third level.

21. A semiconductor integrated circuit device according to claim 20,
wherein said selection circuit selects that one of said first output voltage and said second output voltage having the greater magnitude and outputs the same as said internal supply voltage.

22. A semiconductor integrated circuit device according to claim 17,
wherein said first voltage generator comprises at least one MOSFET,
wherein said first voltage level corresponds to the threshold level of said MOSFET in said first voltage generator,
wherein said second voltage generator comprises at least one MOSFET, and
wherein said second voltage level corresponds to the threshold level of said MOSFET in said second voltage generator.

23. A semiconductor integrated circuit device according to claim 17,
wherein said internal circuit is adapted to operate in a normal operation mode, when said first supply voltage is in said first range, and
wherein said internal circuit is adapted to operate in a test operation mode, when said first supply voltage is in said second range.

24. A semiconductor integrated circuit device according to claim 23,
wherein said test operation mode is a burn-in test operation mode.

25. A semiconductor integrated circuit device according to claim 14,
wherein said internal circuit is inclusive of an arrangement comprised of:

a plurality of bit lines;
a plurality of word lines; and
a plurality of memory cells arranged like latticework on the cross points of said plurality of bit lines and said plurality of word lines.

26. A semiconductor integrated circuit device formed on a semiconductor substrate comprising:
(a) a voltage conversion circuit comprising:
(1) a first voltage generator supplied with a first supply voltage and a second supply voltage lower in magnitude than said first supply voltage, and outputting a first output voltage;
(2) a second voltage generator supplied with said first supply voltage and said second supply voltage, and outputting a second output voltage; and
(3) a selection circuit for receiving said first output voltage and said second output voltage, and outputting an internal supply voltage based on one of said first output voltage and said second output voltage, and
(b) an internal circuit for receiving said internal supply voltage,
wherein said first voltage generator comprises first adjusting means, said first adjusting means adjusting the level of said first output voltage.

27. A semiconductor integrated circuit device according to claim 26,
wherein said second voltage generator comprises second adjusting means, said second adjusting means adjusting the level of said second output voltage.

28. A semiconductor integrated circuit device according to claim 26,
wherein said first output voltage is produced on the basis of said second supply voltage, and
wherein said second output voltage is produced on the basis of said first supply voltage.

29. A semiconductor integrated circuit device according to claim 28,
wherein said first output voltage is higher in magnitude than said second supply voltage by a predetermined first voltage level, and
wherein said second output voltage is lower in magnitude than said first supply voltage by a predetermined second voltage level.

30. A semiconductor integrated circuit device according to claim 29,
wherein said selection circuit selects that one of said first output voltage and said second output voltage having the greater magnitude, and outputs the same as said internal supply voltage.

31. A semiconductor integrated circuit device according to claim 28,
wherein said first output voltage is higher in magnitude than said second supply voltage by a predetermined first voltage level, when said first supply voltage is within a first range, and
wherein said second output voltage is lower in magnitude than said first supply voltage by a predetermined second voltage level, when said first supply voltage is within a second range.

32. A semiconductor integrated circuit device according to claim 31,
wherein said first range and said second range are consecutively occurring ranges.

33. A semiconductor integrated circuit device according to claim 32,
wherein said first output voltage is substantially the same as said first supply voltage, when said first supply voltage is within a third range, and
wherein said first range and said third range are consecutively occurring ranges.

34. A semiconductor integrated circuit device according to claim 33,
wherein said third range of said first supply voltage is associated with voltages between a first level and a second level, higher than said first level,
wherein said first range of said first supply voltage is associated with voltages between said second level and a third level, higher than said second level, and
wherein said second range of said first supply voltage is associated with voltages between said third level and a fourth level, higher than said third level.

35. A semiconductor integrated circuit device according to claim 34,
wherein said selection circuit selects that one of said first output voltage and said second output voltage having the greater magnitude and outputs the same as said internal supply voltage.

36. A semiconductor integrated circuit device according to claim 31,
wherein said first voltage generator comprises at least one MOSFET,
wherein said first voltage level corresponds to the threshold level of said MOSFET in said first voltage generator,
wherein said second voltage generator comprises at least one MOSFET, and
wherein said second voltage level corresponds to the threshold level of said MOSFET in said second voltage generator.

37. A semiconductor integrated circuit device according to claim 31,
wherein said internal circuit is adapted to operate in a normal operation mode, when said first supply voltage is in said first range, and
wherein said internal circuit is adapted to operate in a test operation mode, when said first supply voltage is in said second range.

38. A semiconductor integrated circuit device according to claim 37,
wherein said test operation mode is a burn-in test operation mode.

39. A semiconductor integrated circuit device according to claim 26,
wherein said internal circuit is inclusive of an arrangement comprised of:
a plurality of bit lines;
a plurality of word lines; and
a plurality of memory cells arranged like latticework on the cross points of said plurality of bit lines and said plurality of word lines.

40. A semiconductor integrated circuit device according to claim 26,
wherein said first adjusting means comprises at least one fuse element.

41. A semiconductor integrated circuit device according to claim 26,
wherein said first adjusting means comprises a non-volatile storage element.

42. A semiconductor integrated circuit device according to claim 41,
wherein said non-volatile storage element comprises an electrically programmable erasable random access memory.

43. A semiconductor integrated circuit device according to claim 27,
wherein said second adjusting means comprises at least one fuse element.

44. A semiconductor integrated circuit device according to claim 27,
wherein said second adjusting means comprises a non-volatile storage element.

45. A semiconductor integrated circuit device according to claim 44,
wherein said non-volatile storage element comprises an electrically programmable erasable random access memory.

46. A semiconductor integrated circuit device formed on a semiconductor substrate comprising:
(a) a voltage conversion circuit comprising:
(1) a first voltage generator supplied with a first supply voltage and a second supply voltage lower in magnitude than said first supply voltage, said first voltage generator producing a first output voltage on the basis of said second supply voltage;
(2) a second voltage generator supplied with said first supply voltage and said second supply voltage, said second voltage generator-producing a second output voltage on the basis of said first supply voltage;
(3) a third voltage generator for receiving said first output voltage, and outputting a third output voltage;
(4) a fourth voltage generator for receiving said second supply voltage, and outputting a fourth output voltage; and
(5) a selection circuit for receiving said third output voltage and said fourth output voltage, and outputting an internal supply voltage based on one of said third output voltage and said fourth output voltage, and
(b) an internal circuit for receiving said internal supply voltage.

47. A semiconductor integrated circuit device according to claim 46,
wherein said first output voltage is higher in magnitude than said second supply voltage by a predetermined first voltage level, and
wherein said second output voltage is lower in magnitude than said first supply voltage by a predetermined second voltage level.

48. A semiconductor integrated circuit device according to claim 47,
wherein said selection circuit selects that one of said third output voltage and said fourth output voltage having the greater magnitude, and outputs the same as said internal supply voltage.

49. A semiconductor integrated circuit device according to claim 46,
wherein said first output voltage is higher in magnitude than said second supply voltage by a predetermined first voltage level, when said first supply voltage is within a first range, and
wherein said second output voltage is lower in magnitude than said first supply voltage by a predetermined second voltage level, when said first supply voltage is within a second range.

50. A semiconductor integrated circuit device according to claim 49,
wherein said first range and said second range are consecutively occurring ranges.

51. A semiconductor integrated circuit device according to claim 50,
wherein said first output voltage is substantially the same as said first supply voltage, when said first supply voltage is within a third range, and
wherein said first range and said third range are consecutively occurring ranges.

52. A semiconductor integrated circuit device according to claim 51,
wherein said third range of said first supply voltage is associate with voltages between a first level and a second level, higher than said first level,
wherein said first range of said first supply voltage is associated with voltages between said second level and a third level, higher than said second level, and
wherein said second range of said first supply voltage is associated with voltages between said third level and a fourth level, higher than said third level.

53. A semiconductor integrated circuit device according to claim 49,
wherein said first voltage generator comprises at least one MOSFET,
wherein said first voltage level corresponds to the threshold level of said MOSFET in said first voltage generator,
wherein said second voltage generator comprises at least one MOSFET, and
wherein said second voltage level corresponds to the threshold level of said MOSFET in said second voltage generator.

54. A semiconductor integrated circuit device according to claim 49,
wherein said internal circuit is adapted to operate in a normal operation mode, when said first supply voltage is in said first range, and
wherein said internal circuit is adapted to operate in a test operation mode, when said first supply voltage is in said second range.

55. A semiconductor integrated circuit device according to claim 54,
wherein said test operation mode is a burn-in test operation mode.

56. A semiconductor integrated circuit device according to claim 46,
wherein said internal circuit is inclusive of an arrangement comprised of:
a plurality of bit lines;
a plurality of word lines; and
a plurality of memory cells arranged like latticework on the cross points of said plurality of bit lines and said plurality of word lines.

57. A semiconductor integrated circuit device according to claim 49,
wherein said third output voltage is higher in magnitude than said second supply voltage by a predetermined third voltage level, when said first supply voltage is within a fourth range, and
wherein said fourth output voltage is lower in magnitude than said first supply voltage by a predetermined fourth voltage level, when said first supply voltage is within a fifth range.

58. A semiconductor integrated circuit device according to claim 57,
wherein said fourth range and said fifth range are consecutively occurring ranges.

59. A semiconductor integrated circuit device according to claim 58, wherein said third output voltage is substantially the same as said first supply voltage, when said first supply voltage is within a sixth range, and wherein said fourth range and said sixth range are consecutively occurring ranges.

60. A semiconductor integrated circuit device according to claim 59, wherein said sixth range of said first supply voltage is associated with voltages between a fourth level and a fifth level, higher than said fourth level, wherein said fourth range of said first supply voltage is associated with voltages between said fifth level and a sixth level, higher than said fifth level, and wherein said fifth range of said first supply voltage is associated with voltages between said sixth level and a seventh level, higher than said sixth level.

61. A semiconductor integrated circuit device according to claim 60, wherein said selection circuit selects that one of said third output voltage and said fourth output voltage having the greater magnitude and outputs the same as said internal supply voltage.

62. A semiconductor integrated circuit device according to claim 46, wherein said third voltage generator comprises:

an operational amplifier circuit having a first input for receiving said first output voltage and a second input, said operational amplifier circuit outputting a fifth output voltage;

a switch circuit having a control terminal coupled to receive said fifth output voltage;

an output terminal, coupled to said switch circuit, for outputting said third output voltage; and a feedback circuit, coupled to said output terminal and said switch circuit, for providing a first standard potential to said second input of said operational amplifier circuit.

63. A semiconductor integrated circuit device according to claim 62, wherein said switch circuit comprises a MOSFET having a gate coupled to receive said fifth output voltage and a source-drain path coupled between said first supply voltage and said second supply voltage, wherein said feedback circuit comprises a plurality of resistors formed in a series arrangement between one end of said source-drain path of said MOSFET and said second supply voltage, wherein said second input is coupled to one end of one of said plurality of resistors, and wherein said output terminal is coupled to said one end of said source-drain path of said MOSFET.

64. A semiconductor integrated circuit device formed on a semiconductor substrate comprising:

(a) a voltage conversion circuit comprising:

(1) a first standard voltage generator supplied with a first supply voltage and a second supply voltage lower in magnitude than said first supply voltage, said first standard voltage generator producing a first output voltage on the basis of said second supply voltage;

(2) a second standard voltage generator supplied with said first supply voltage and said second supply voltage, said second standard voltage generator producing a second output voltage on the basis of said first supply voltage;

(3) a first booster circuit for receiving said first output voltage, and outputting a third output voltage;

(4) a second booster circuit for receiving said second output voltage, and outputting a fourth output voltage; and (5) a selection circuit for receiving said third output voltage and said fourth output voltage, and outputting an internal supply voltage based on one of said third output voltage and said fourth output voltage, and (b) an internal circuit for receiving said internal supply voltage, wherein said first voltage generator comprises first adjusting means, said first adjusting means adjusts the level of said first output voltage.

65. A semiconductor integrated circuit device according to claim 64, wherein said first booster circuit comprises:

an operational amplifier circuit having a first input for receiving said first output voltage and a second input, said operational amplifier circuit outputting a fifth output voltage;

a switch circuit having a control terminal coupled to receive said fifth output voltage;

an output terminal coupled to said switch circuit and for providing said third output voltage; and a feedback circuit, coupled to said output terminal and said switch circuit, for providing a first standard potential to said second input of said operational amplifier circuit.

66. A semiconductor integrated circuit device according to claim 65, wherein said switch circuit comprises a MOSFET having a gate coupled to receive said fifth output voltage and a source-drain path coupled between said first supply voltage and said second supply voltage, wherein said feedback circuit comprises a plurality of resistors formed in a series between one end of said source-drain path of said MOSFET and said second supply voltage, wherein said second input is coupled to one end of one of said plurality of resistors, and wherein said output terminal is coupled to said one end of said source-drain path of said MOSFET.

67. A semiconductor integrated circuit device according to claim 66, wherein said first adjusting means changes the feedback rate of said feedback circuit.

68. A semiconductor integrated circuit device according to claim 64, wherein said second booster circuit comprises second adjusting means, said second adjusting means adjusts the level of said fourth output voltage.

69. A semiconductor integrated circuit device according to claim 64, wherein said first adjusting means comprises at least one fuse element.

70. A semiconductor integrated circuit device according to claim 64, wherein said first adjusting means comprises a non-volatile storage element.

71. A semiconductor integrated circuit device according to claim 70, wherein said non-volatile storage element comprises an electrically programmable erasable random access memory.

72. A semiconductor integrated circuit device according to claim 68,
wherein said first adjusting means comprises at least one fuse element.

73. A semiconductor integrated circuit device according to claim 68,
wherein said first adjusting means comprises a non-volatile storage element.

74. A semiconductor integrated circuit device according to claim 73,
wherein said non-volatile storage element comprises an electrically programmable erasable random access memory.

75. A semiconductor integrated circuit device according to claim 64,
wherein said first output voltage is higher in magnitude than said second supply voltage by a predetermined first voltage level, and
wherein said second output voltage is lower in magnitude than said first supply voltage by a predetermined second voltage level.

76. A semiconductor integrated circuit device according to claim 75,
wherein said selection circuit selects that one of said third output voltage and said fourth output voltage having the greater magnitude, and outputs the same as said internal supply voltage.

77. A semiconductor integrated circuit device according to claim 64,
wherein said first output voltage is higher in magnitude than said second supply voltage by a predetermined first voltage level, when said first supply voltage is within a first range, and
wherein said second output voltage is lower in magnitude than said first supply voltage by a predetermined second voltage level, when said first supply voltage is within a second range.

78. A semiconductor integrated circuit device according to claim 77,
wherein said first range and said second range are consecutively occurring ranges.

79. A semiconductor integrated circuit device according to claim 78,
wherein said first output voltage is substantially the same as said first supply voltage, when said first supply voltage is within a third range, and
wherein said first range and said third range are consecutively occurring ranges.

80. A semiconductor integrated circuit device according to claim 79,
wherein said third range of said first supply voltage is associated with voltages between a first level and a second level, higher than said first level,
wherein said first range of said first supply voltage is associated with voltages between said second level and a third level, higher than said second level, and
wherein said second range of said first supply voltage is associated with voltages between said third level and a fourth level, higher than said third level.

81. A semiconductor integrated circuit device according to claim 77,
wherein said first standard voltage generator comprises at least one MOSFET,
wherein said first voltage level corresponds to the threshold level of said MOSFET in said first standard voltage generator,
wherein said second standard voltage generator comprises at least one MOSFET, and
wherein said second voltage level corresponds to the threshold level of said MOSFET in said second standard voltage generator.

82. A semiconductor integrated circuit device according to claim 77,
wherein said internal circuit is adapted to operate in a normal operation mode, when said first supply voltage is in said first range, and
wherein said internal circuit is adapted to operate in a test operation mode, when said first supply voltage is in said second range.

83. A semiconductor integrated circuit device according to claim 82,
wherein said test operation mode is a burn-in test operation mode.

84. A semiconductor integrated circuit device according to claim 64,
wherein said internal circuit is inclusive of an arrangement comprised of:
a plurality of bit lines;
a plurality of word lines; and
a plurality of memory cells arranged like latticework on the cross points of said plurality of bit lines and said plurality of word lines.

85. A semiconductor integrated circuit device according to claim 79,
wherein said third output voltage is higher in magnitude than said second supply voltage by a predetermined third voltage level, when said first supply voltage is within a fourth range, and
wherein said fourth output voltage is lower in magnitude than said first supply voltage by a predetermined fourth voltage level, when said first supply Voltage is within a fifth range.

86. A semiconductor integrated circuit device according to claim 85,
wherein said fourth range and said fifth range are consecutively occurring ranges.

87. A semiconductor integrated circuit device according to claim 86,
wherein said third output voltage is substantially the same as said first supply voltage, when said first supply voltage is within a sixth range, and
wherein said fourth range and said sixth range are consecutively occurring ranges.

88. A semiconductor integrated circuit device according to claim 87,
wherein said sixth range of said first supply voltage is associated with voltages between a fourth level and a fifth level, higher than said fourth level,
wherein said fourth range of said first supply voltage is associated with voltages between said fifth level and a sixth level, higher than said fifth level, and
wherein said fifth range of said first supply voltage is associated with voltages between said sixth level and a seventh level, higher than said sixth level.

89. A semiconductor integrated circuit device according to claim 88,
wherein said selection circuit selects that one of said third output voltage and said fourth output voltage having the greater magnitude, and outputs the same as said internal supply voltage.

* * * * *